(12) United States Patent　　　　　(10) Patent No.:　US 12,575,149 B2

Ozaki et al.　　　　　　　　　　　　　(45) Date of Patent:　　Mar. 10, 2026

---

(54) SEMICONDUCTOR DEVICE

(71) Applicant: FUJI ELECTRIC CO., LTD.,
Kawasaki (JP)

(72) Inventors: Daisuke Ozaki, Okaya (JP); Seiji Noguchi, Matsumoto (JP); Yosuke Sakurai, Azumino (JP); Ryutaro Hamasaki, Matsumoto (JP); Takuya Yamada, Matsumoto (JP); Yoshihiro Ikura, Matsumoto (JP)

(73) Assignee: FUJI ELECTRIC CO., LTD.,
Kanagawa (JP)

( * ) Notice: Subject to any disclaimer, the term of this patent is extended or adjusted under 35 U.S.C. 154(b) by 468 days.

(21) Appl. No.: 18/067,743

(22) Filed: Dec. 19, 2022

(65) Prior Publication Data

US 2023/0124922 A1　　Apr. 20, 2023

Related U.S. Application Data

(63) Continuation of application No. PCT/JP2021/036687, filed on Oct. 4, 2021.

(30) Foreign Application Priority Data

Jan. 25, 2021　(JP) ................................. 2021-009648

(51) Int. Cl.
　*H10D 62/17*　　　(2025.01)
　*H10D 12/00*　　　(2025.01)
　*H10D 62/10*　　　(2025.01)

(52) U.S. Cl.
　CPC ......... *H10D 62/177* (2025.01); *H10D 12/481* (2025.01); *H10D 62/107* (2025.01); *H10D 62/127* (2025.01)

(58) Field of Classification Search
CPC .. H10D 12/441; H10D 12/461; H10D 12/415; H10D 12/481; H10D 62/105;
(Continued)

(56) References Cited

U.S. PATENT DOCUMENTS 8,519,477 B2 *　8/2013　Hsieh ................... H10D 84/016
　　　　　　　　　　　　　　　257/341
8,829,607 B1 *　9/2014　Hsieh ................... H10D 30/668
　　　　　　　　　　　　　　　257/334

(Continued)

FOREIGN PATENT DOCUMENTS

EP　　　2787534 A1　10/2014
EP　　　3659180 B1　12/2020
(Continued)

OTHER PUBLICATIONS

International Search Report and (ISA/237) Written Opinion of the International Search Authority for International Patent Application No. PCT/JP2021/036687, mailed by the Japan Patent Office on Nov. 30, 2021.
(Continued)

*Primary Examiner* — Natalia A Gondarenko

(57) ABSTRACT

Provided is a semiconductor device comprising a semiconductor substrate, the semiconductor substrate comprising an active portion, a second conductivity type circumferential well region surrounding the active portion in a top view, and a trench portion provided in the active portion on an upper surface of the semiconductor substrate, wherein the active portion includes a center portion including a first conductivity type emitter region, and a circumferential portion surrounding the center portion, wherein the center portion includes a second conductivity type active side bottom region provided across bottoms of at least two of the trench portion, the circumferential portion includes a second conductivity type circumferential side bottom region electri- (Continued)

cally connected to the circumferential well region, facing the active side bottom region, and provided at the bottom of the trench portion, and the active side bottom region and the circumferential side bottom region are provided apart from each other.

24 Claims, 28 Drawing Sheets

(58) Field of Classification Search

CPC .. H10D 62/107; H10D 62/126; H10D 62/127; H10D 62/145; H10D 62/177; H10D 64/112; H10D 64/117; H10D 64/519; H10D 12/411–491; H10D 12/01; H10D 12/031–038; H10D 62/141–148; H10D 62/393; H10D 62/152–155; H10D 62/156–159; H10D 30/0281–0289; H10D 30/0267; H10D 30/0287; H10D 30/0295; H10D 30/601–608; H10D 84/40–409; H10D 30/668; H10D 30/658; H10D 30/65–659; H10D 30/603

USPC ................ 257/139, 140, 335, 337, 324, 343

See application file for complete search history.

(56) References Cited

U.S. PATENT DOCUMENTS

| | | | |
|---|---|---|---|
| 2004/0094798 A1 | 5/2004 | Hara | |
| 2005/0156201 A1 | 7/2005 | Matsuda | |
| 2014/0027840 A1* | 1/2014 | Guan | H10D 62/127 |
| | | | 438/270 |
| 2014/0231866 A1 | 8/2014 | Senoo | |
| 2016/0359026 A1 | 12/2016 | Matsuura | |
| 2017/0012122 A1 | 1/2017 | Takaya | |
| 2017/0040446 A1 | 2/2017 | Saito | |
| 2018/0019319 A1 | 1/2018 | Baburske | |
| 2018/0248008 A1 | 8/2018 | Sugawara | |
| 2018/0286971 A1 | 10/2018 | Philippou | |
| 2019/0035927 A1* | 1/2019 | Iwaya | H10D 30/668 |
| 2019/0123185 A1 | 4/2019 | Vellei | |
| 2019/0123186 A1 | 4/2019 | Philippou | |
| 2023/0124922 A1 | 4/2023 | Ozaki | |

FOREIGN PATENT DOCUMENTS

| | | |
|---|---|---|
| JP | 2004095954 A | 3/2004 |
| JP | 2005209811 A | 8/2005 |
| JP | 2018182313 A | 11/2018 |
| JP | 6472714 B2 | 2/2019 |
| JP | 2019091892 A | 6/2019 |
| JP | 2019110288 A | 7/2019 |
| JP | 6618960 B2 | 12/2019 |
| JP | 6728953 B2 | 7/2020 |
| WO | 2015098169 A1 | 7/2015 |
| WO | 2017064887 A1 | 4/2017 |
| WO | 2022158053 A1 | 7/2022 |

OTHER PUBLICATIONS

Office Action issued for counterpart German Application 112021002612.7, issued by the German Patent and Trademark Office on Dec. 19, 2025 (received on Dec. 20, 2025).

* cited by examiner

SEMICONDUCTOR DEVICE

BACKGROUND

1. Technical Field

The present invention relates to a semiconductor device.

2. Related Art

Conventionally, in semiconductor device such as an Insulated Gate Bipolar Transistor (IGBT) or the like, there is known a configuration in which an impurity region is provided at a bottom of a trench portion (for example, see Patent Documents 1 and 2).

Patent Document 1: Japanese Patent Application Publication No. 2019-91892

Patent Document 2: Japanese Patent Application Publication No. 2019-110288

DESCRIPTION OF EXEMPLARY EMBODIMENTS

Figure 1:
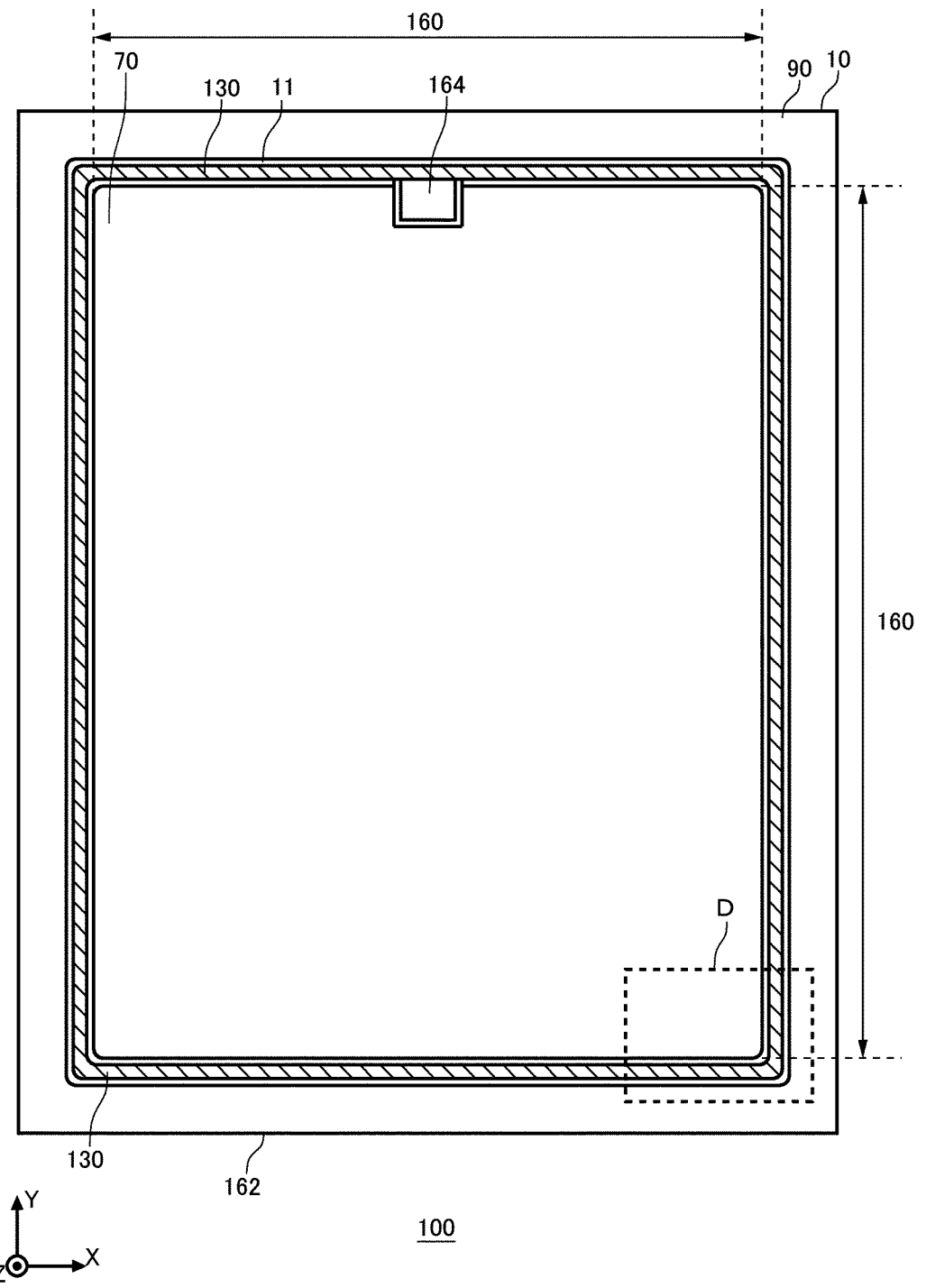
FIG. 1 is a top view showing an example of a semiconductor device 100.

Hereinafter, the present invention will be described through embodiments of the invention, but the embodiments hereinafter do not limit the invention according to the scope of the claims. In addition, not all combinations of the features described in the embodiments necessarily have to be necessary to solving means of the invention.

As used in the present specification, one side in a direction parallel to a depth direction of a semiconductor substrate is referred to as "upper" and the other side is referred to as "lower". One surface of two principal surfaces of a substrate, a layer or other member is referred to as 'upper surface', and the other surface is referred to as 'lower surface'. "Upper" and "lower" directions are not limited to a direction of gravity, or a direction in which a semiconductor device is mounted.

As used in the present specification, the technical matters may be described by using orthogonal coordinate axes of X axis, Y axis and Z axis. The orthogonal coordinate axes simply specify a relative position of a constitutional element, not limiting a particular direction. For example, the Z axis does not limit a height direction with respect to the ground. Note that, the +Z axis direction and the −Z axis direction are opposite to each other. When the Z axis direction is simply described without denoting +/−, it means a direction parallel to the +Z axis and the −Z axis.

In the present specification, orthogonal axes parallel to the upper surface and the lower surface of the semiconductor substrate are referred to as the X axis and the Y axis. In addition, the axis perpendicular to the upper surface and the lower surface of the semiconductor substrate is defined as the Z axis. As used in the present specification, the direction of the Z axis may be referred to as a depth direction. In addition, as used in the present specification, a direction parallel to the upper surface and the lower surface of the semiconductor substrate, including the X axis and the Y axis, may be referred to as a horizontal direction.

Further, the region from the center of the semiconductor substrate in the depth direction to the upper surface of the semiconductor substrate may be referred to as an upper surface side. Similarly, the region from the center of the semiconductor substrate in the depth direction to the lower surface of the semiconductor substrate may be referred to as a lower surface side.

As used in the present specification, when referred to as "same" or "equal", it may include a case where there is an error due to a manufacturing variation and the like. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor showing a conductivity type of the N type, or a semiconductor showing a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is $N_D$ and the acceptor concentration is $N_A$, the net doping concentration at any position is given as $N_D$-$N_A$. In the present specification, the net doping concentration may be simply described as a doping concentration.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be called as a hydrogen donor.

A P+ type or an N+ type described in the present specification means a doping concentration higher than that of the P type or the N type, and a P− type or an N− type described herein means a doping concentration lower than that of the P type or the N type. In addition, a P++ type or an N++ type described in the present specification means a doping concentration higher than that of the P+ type or the N+ type. In the present specification, a unit system is the SI base unit system unless otherwise particularly noted. Although a unit of length is shown using cm, it may be converted to meters (m) before performing calculations.

A chemical concentration in the present specification refers to an atomic density of an impurity measured regardless of an electrical activation state. The chemical concentration (atomic density) can be measured by, for example, secondary ion mass spectrometry (SIMS). The net doping concentration described above can be measured by capacitance-voltage profiling method (CV method). In addition, a carrier concentration measured by spreading resistance profiling method (SR method) may be set as the net doping concentration. The carrier concentration measured by the CV method or the SR method may be a value in a thermal equilibrium state. In addition, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be called a donor concentration, and the doping concentration of the P type region may be called an acceptor concentration.

In addition, when a concentration distribution of the donor, acceptor, or net doping has a peak in a region, a value of the peak may be set as the concentration of the donor, acceptor, or net doping in the region. When the concentration of the donor, acceptor or net doping is approximately uniform in a region, or the like, an average value of the concentration of the donor, acceptor or net doping in the region may be set as the concentration of the donor, acceptor or net doping. In the present specification, atoms/cm$^3$ or/cm$^3$ is used to indicate a concentration per unit volume. This unit is used for a concentration of a donor or an acceptor in a semiconductor substrate, or a chemical concentration. A notation of atoms may be omitted.

The carrier concentration measured by the SR method may be lower than the concentration of the donor or the acceptor. In a range where a current flows when a spreading resistance is measured, the carrier mobility of the semiconductor substrate may be lower than a value of that in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV method or the SR method may be lower than a chemical concentration of an element showing the donor or the acceptor. As an example, in a silicon semiconductor, a donor concentration of phosphorous or arsenic serving as a donor or an acceptor concentration of boron (boron) serving as an acceptor is substantially 99% of chemical concentrations of these. On the other hand, in the silicon semiconductor, a donor concentration of hydrogen serving as a donor is approximately 0.1% to 10% of a chemical concentration of hydrogen. Each concentration in the present specification may be a value at room temperature. As an example, a value at 300K (Kelvin) (substantially 26.9 degrees C.) may be used for a value at room temperature.

FIG. 1 is a top view showing an example of the semiconductor device 100. FIG. 1 shows positions at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of semiconductor material. As an example, the semiconductor substrate 10 is a silicon substrate, but a material of the semiconductor substrate 10 is not limited to silicon.

The semiconductor substrate 10 has an end side 162 in a top view. When a top view is simply mentioned in the present specification, it means that the semiconductor substrate 10 is viewed from an upper surface side. The semiconductor substrate 10 of the present example has two sets of end sides 162 facing each other in a top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where the main current flows in the depth direction between the upper surface and the lower surface of the semiconductor substrate 10 when the semiconductor device 100 operates. An emitter electrode is provided above the active portion 160, but an illustration thereof is omitted in FIG. 1.

In the present example, the active portion 160 is provided with a transistor portion 70 including a transistor element such as an IGBT. In another example, the transistor portion 70 and the diode portion including the diode element such as a Free Wheel Diode (FWD) may be alternately disposed along a predetermined array direction on the upper surface of the semiconductor substrate 10.

The transistor portion 70 has the collector region of the P+ type in a region in contact with the lower surface of the semiconductor substrate 10. In the transistor portion 70, a gate structure including an N++ type emitter region, a P– type base region, a gate conductive portion, and a gate dielectric film is periodically disposed on the upper surface side of the semiconductor substrate 10.

The semiconductor device 100 may have one or more pads above the semiconductor substrate 10. The semiconductor device 100 of the present example has a gate pad 164. The semiconductor device 100 may have a pad such as an anode pad, a cathode pad, and a current detection pad. Each pad is disposed in the vicinity of the end side 162. The vicinity of the end side 162 refers to a region between the end side 162 and the emitter electrode in a top view. When the semiconductor device 100 is mounted, each pad may be connected to an external circuit via wiring such as a wire.

A gate potential is applied to the gate pad 164. The gate pad 164 is electrically connected to the conductive portion of a gate trench portion of the active portion 160. The semiconductor device 100 includes a gate runner 130 that connects the gate pad 164 and the gate trench portion. In FIG. 1, the gate runner 130 is hatched with diagonal lines.

The gate runner 130 is disposed between the active portion 160 and the end side 162 of the semiconductor substrate 10 in a top view. The gate runner 130 of the present example surrounds the active portion 160 in a top view. A region surrounded by the gate runner 130 in a top view may be the active portion 160. The gate runner 130 is connected to the gate pad 164. The gate runner 130 is disposed above the semiconductor substrate 10. The gate runner 130 may be a metal wiring including aluminum or the like.

A circumferential well region 11 is provided to overlap with the gate runner 130. That is, similarly to the gate runner 130, the circumferential well region 11 surrounds the active portion 160 in a top view. The circumferential well region 11 is also provided to extend with a predetermined width in a range not overlapping with the gate runner 130. The circumferential well region 11 is a region of the second conductivity type. The circumferential well region 11 of the present example is of P+ type (see FIG. 2). An impurity concentration of the circumferential well region 11 may be $5.0 \times 10^{17}$ atoms/cm$^3$ or more and $5.0 \times 10^{19}$ atoms/cm$^3$ or less. The impurity concentration of the circumferential well region 11 may be $2.0 \times 10^{18}$ atoms/cm$^3$ or more and $2.0 \times 10^{19}$ atoms/cm$^3$ or less.

Further, the semiconductor device 100 may include a temperature sensing portion (not shown) that is a PN junction diode formed of polysilicon or the like, and a current detection portion (not shown) that simulates an operation of the transistor portion 70 provided on the active portion 160.

The semiconductor device 100 of the present example includes an edge termination structure portion 90 between the active portion 160 and the end side 162 in a top view. The edge termination structure portion 90 of the present example is disposed between the circumferential gate runner 130 and the end side 162. The edge termination structure portion 90 reduces an electric field strength on the upper surface side of the semiconductor substrate 10. The edge termination structure portion 90 may be provided with at least one of a guard ring, a field plate, and a RESURF provided annularly to surround the active portion 160.

Figure 2:
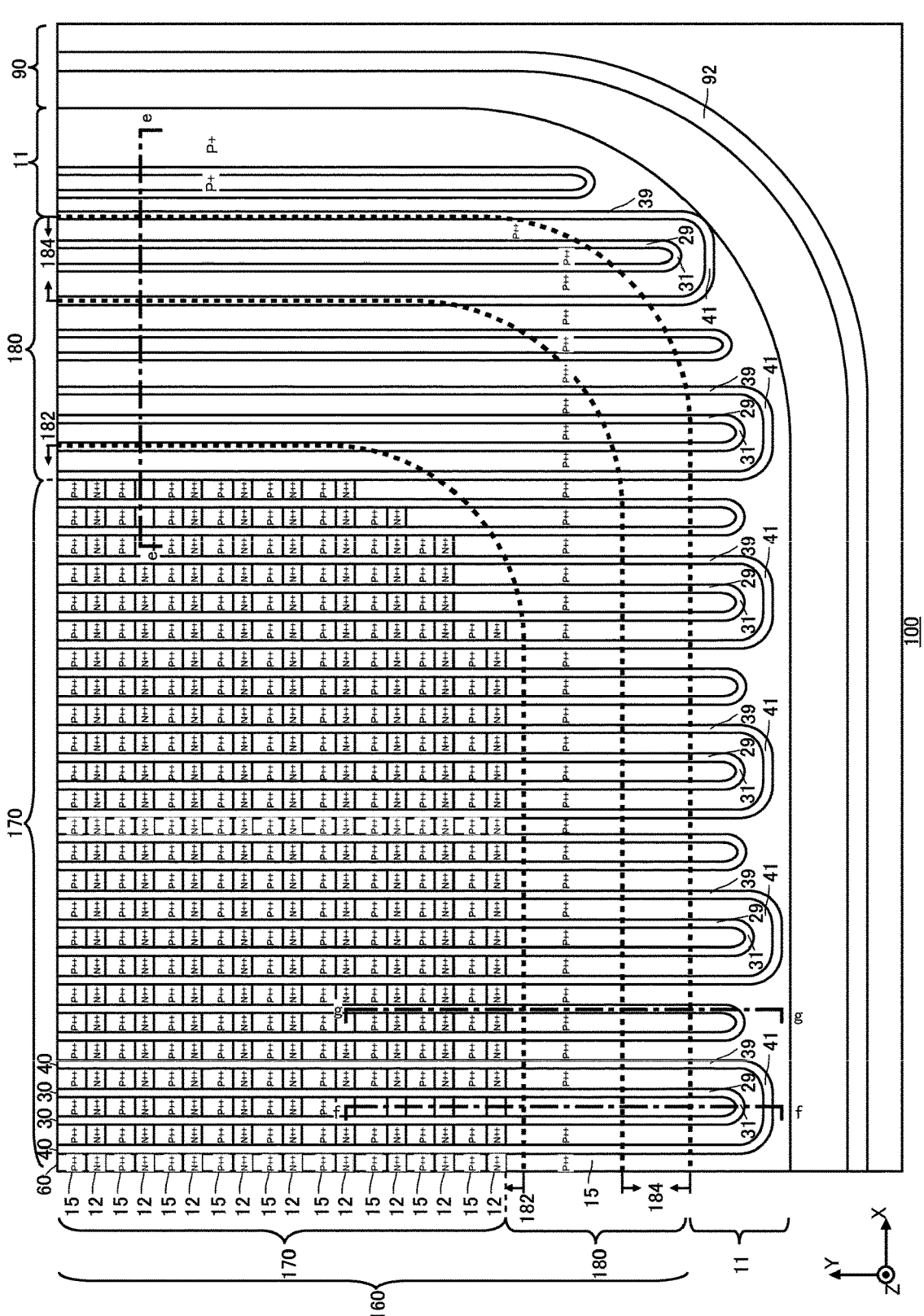
FIG. 2 is an enlarged drawing of a region D in FIG. 1.

FIG. 2 is an enlarged drawing of a region D in FIG. 1. The region D is a region including the transistor portion 70. The semiconductor device 100 of the present example includes a gate trench portion 40, a dummy trench portion 30, the circumferential well region 11, an emitter region 12, and a contact region 15 provided inside of the upper surface side of the semiconductor substrate 10. The gate trench portion 40 and the dummy trench portion 30 are each an example of a trench portion.

The semiconductor device 100 of the present example includes an emitter electrode and the gate runner 130 provided above the upper surface of the semiconductor substrate 10. The emitter electrode and the gate runner 130 are provided to be separated from each other. An interlayer dielectric film is provided between the emitter electrode and the gate runner 130, and the upper surface of the semiconductor substrate 10. In FIG. 2, illustrations of the emitter electrode, the gate runner 130 and the interlayer dielectric film are omitted.

The emitter electrode is provided above the gate trench portion 40, the dummy trench portion 30, the circumferential well region 11, the emitter region 12, and the contact region 15. The emitter electrode is in contact with the emitter region 12 and the contact region 15 on the upper surface of the semiconductor substrate 10 through a contact hole. Further, the emitter electrode is connected to a dummy conductive portion in the dummy trench portion 30 through the contact hole provided in the interlayer dielectric film. The emitter electrode may be connected to the dummy conductive portion of the dummy trench portion 30 at an edge portion 31 of the dummy trench portion 30 in the Y axis direction.

The gate runner 130 is connected to the gate trench portion 40 through the contact hole provided in the interlayer dielectric film. The gate runner 130 may be connected to a gate conductive portion of the gate trench portion 40 at an edge portion 41 of the gate trench portion 40 in the Y axis direction. The gate runner 130 is not connected to the dummy conductive portion in the dummy trench portion 30.

The emitter electrode is formed of a material including a metal. For example, at least a part of a region of the emitter electrode is formed of aluminum or an aluminum-silicon alloy, for example, a metal alloy such as AlSi or AlSiCu. The emitter electrode may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The transistor portion 70 has a plurality of trench portions disposed in the array direction. In the present example, the trench portion is provided in the active portion 160 and the circumferential well region 11 on the upper surface of the semiconductor substrate 10. The trench portion is provided in a striped pattern in a top view in the transistor portion 70. In the transistor portion 70, one or more gate trench portions 40 and one or more dummy trench portions 30 are alternately provided along the array direction. In the present example, one gate trench portion 40 and two dummy trench portions 30 are alternately provided.

The gate trench portion 40 of the present example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is preferably provided in a curved shape in a top view. By connecting between ends of the two linear portions 39 in the Y axis direction by the edge portion 41, it is possible to reduce the electric field strength at the ends of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. In the present example, two dummy trench portions 30 are provided between the respective linear portions 39. The dummy trench portion 30 may have a linear shape extending in the extending direction, or may have linear portions 29 and the edge portion 31 similarly to the gate trench portion 40. In the present example, each dummy trench portion 30 has the linear portions 29 and the edge portion 31.

A diffusion depth of the circumferential well region 11 may be deeper than depths of the gate trench portion 40 and the dummy trench portion 30. The ends of the gate trench portion 40 and the dummy trench portion 30 in the Y axis direction are provided in the circumferential well region 11 in a top view. That is, at the end of each trench portion in the Y axis direction, a bottom of each trench portion in the depth direction is covered with the circumferential well region 11. This can consequently reduce electric field strength at the bottom of each trench portion. The semiconductor device 100 may include the gate trench portion 40 or the dummy trench portion 30 provided entirely in the circumferential well region 11 in a top view.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of the present example is provided extending in the extending direction (the Y axis direction) along the trench, on the upper surface of the semiconductor substrate 10. In the present example, a mesa portion 60 is provided in the transistor portion 70.

Each mesa portion 60 may be provided with at least one of a first conductivity type emitter region 12 or a second conductivity type contact region 15. In the present example, the emitter region 12 is of an N++ type, and the contact region 15 is of a P++ type. The emitter region 12 and the contact region 15 may be provided between the base region and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10. In the present example, the region in the mesa portion 60 that is exposed on the upper surface of the semiconductor substrate 10 and disposed closest in proximity to the gate runner 130 is the contact region 15.

Each of the contact region 15 and the emitter region 12 in the mesa portion 60 is provided from one trench portion to the other trench portion in the X axis direction. As an example, the contact region 15 and the emitter region 12 in the mesa portion 60 are alternately disposed along the extending direction of the trench portion (the Y axis direction).

In another example, the contact region 15 and the emitter region 12 in the mesa portion 60 may be provided in a striped pattern along the extending direction of the trench portion (the Y axis direction). For example, the emitter region 12 is provided in a region in contact with the trench portion, and the contact region 15 is provided in a region sandwiched between the emitter regions 12.

In FIG. 2, the edge termination structure portion 90 is provided with a guard ring 92. The edge termination structure portion 90 may be provided with a plurality of guard rings 92. An impurity concentration of the guard ring 92 may be the same as that of the circumferential well region 11.

The active portion 160 has a center portion 170 and a circumferential portion 180. The center portion 170 has the emitter region 12. The circumferential portion 180 surrounds the center portion 170. In the present example, the circumferential portion 180 surrounds the center portion 170 in a top view. The boundary between the center portion 170 and the circumferential portion 180 may be the emitter region 12 closest to the circumferential well region 11 in the X axis direction or the Y axis direction.

A contact hole is provided above each mesa portion 60 of the center portion 170. The contact hole of the present example is provided above each region of the contact region 15 and the emitter region 12. The contact hole may be disposed at the center of the mesa portion 60 in the array direction (the X axis direction). In the present example, the contact hole is omitted.

In FIG. 2, an active side bottom region 182 and a circumferential side bottom region 184 provided in the semiconductor substrate 10 are shown. The active side bottom region 182 is provided in the center portion 170. The circumferential side bottom region 184 is provided in the circumferential portion 180. As shown in FIG. 2, the active side bottom region 182 and the circumferential side bottom region 184 are provided apart from each other.

Figure 3:
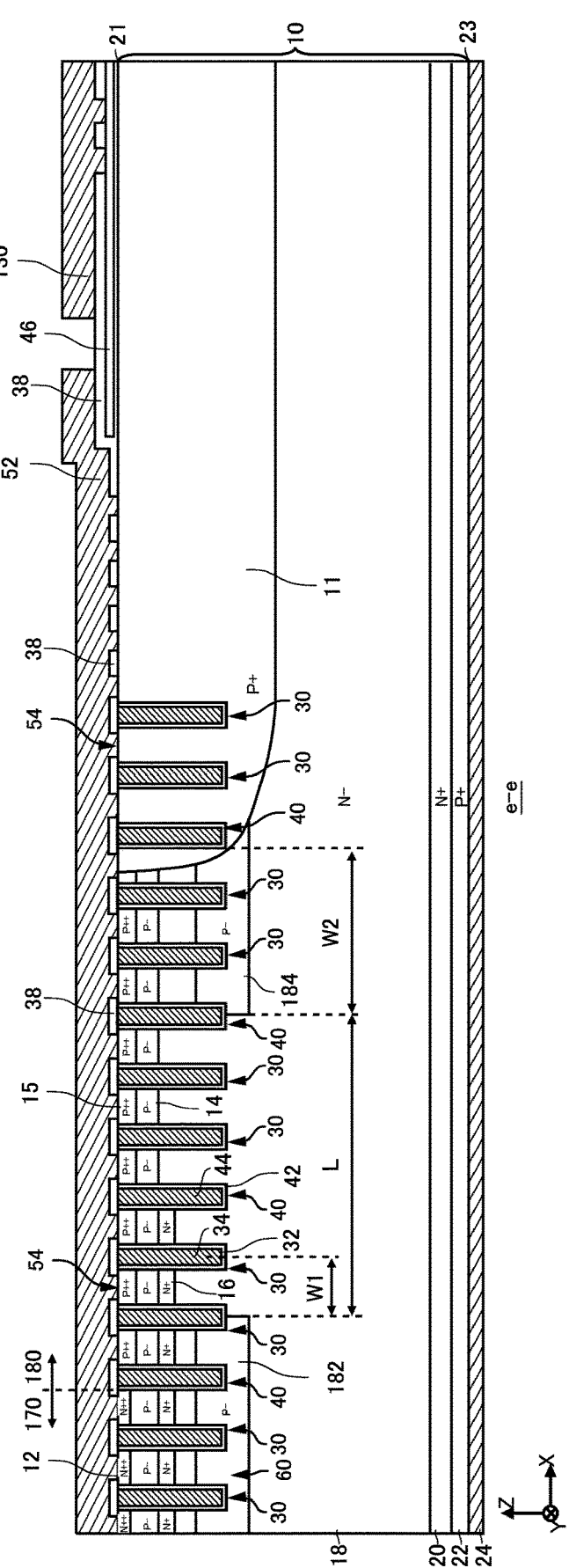
FIG. 3 is a drawing showing an example of the cross section e-e in FIG. 2.

FIG. 3 is a drawing showing an example of a cross section e-e in FIG. 2. The cross section e-e is an X-Z plane that passes through the emitter region 12 of the center portion 170. The dimensions in FIG. 3 do not necessarily match the dimensions in FIG. 2. The semiconductor device 100 of the present example has the semiconductor substrate 10, an interlayer dielectric film 38, an emitter electrode 52, a collector electrode 24, and a gate runner 130 in the cross section.

The interlayer dielectric film 38 is provided on an upper surface 21 of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2. A contact hole 54 is partially provided above the circumferential well region 11, whereby the circumferential well region 11 is connected to the emitter electrode.

The emitter electrode 52 is provided above the interlayer dielectric film 38. The emitter electrode 52 is in contact with an upper surface 21 of the semiconductor substrate 10 through the contact hole 54 of the interlayer dielectric film 38. Note that the emitter electrode 52 may not be provided above the circumferential well region 11. The gate runner 130 may be provided above the circumferential well region 11. A gate polysilicon 46 may be provided under the gate runner 130.

The collector electrode 24 is provided on a lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

Each mesa portion 60 is provided with a second conductivity type base region 14. The emitter region 12 and the contact region 15 are provided between the upper surface 21 of the semiconductor substrate 10 and the base region 14. The base region 14 of the present example is of a P– type.

The semiconductor substrate 10 has a first conductivity type drift region 18. The drift region 18 of the present example is of an N type or an N– type.

The mesa portion 60 of the center portion 170 is provided with the emitter region 12 of the N++ type and the base region 14 of the P– type in order from the upper surface 21 side of the semiconductor substrate 10. The drift region 18 is provided below the base region 14. The mesa portion 60 may be provided with an N+ type accumulation region 16. The accumulation region 16 is disposed between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of the present example is provided in contact with the emitter region 12. The base region 14 may be in contact with the trench portions on both sides of the mesa portion 60. As an example, a peak of an impurity concentration of the base region 14 is $2.5 \times 10^{17}$ atoms/cm$^3$. The impurity concentration of the base region 14 may be $5.0 \times 10^{16}$ atoms/cm$^3$ or more and $1.0 \times 10^{18}$ atoms/cm$^3$ or less.

The accumulation region 16 is provided below the base region 14. The accumulation region 16 is an N+ type region having a higher doping concentration than the drift region 18. The accumulation region 16 may have a concentration peak of a donor such as a phosphorous or hydrogen donor. By providing the accumulation region 16 having the high concentration between the drift region 18 and the base region 14, it is possible to improve a carrier injection enhancement effect (IE effect) and reduce an on-voltage. The accumulation region 16 may be provided to entirely cover a lower surface of the base region 14 in each mesa portion 60.

The mesa portion 60 of the circumferential portion 180 is provided with the P++ type contact region 15 and the P– type base region 14 in order from the upper surface 21 side of the semiconductor substrate 10. The drift region 18 is provided below the base region 14. The accumulation region 16 may be provided in the mesa portion 60 of the circumferential portion 180.

An N+ type buffer region 20 may be provided below the drift region 18. The doping concentration of the buffer region 20 is higher than the doping concentration of the drift region 18. The buffer region 20 may have a concentration peak having a doping concentration higher than that of the drift region 18. The doping concentration of the concentration peak refers to the doping concentration at the local maximum of the concentration peak. As the doping concentration of the drift region 18, an average value of the doping concentration in a region where the doping concentration distribution is approximately flat may be used.

The buffer region 20 may be formed by ion implantation of an N type dopant such as hydrogen (proton) or phosphorous and the like. The buffer region 20 in the present example is formed by ion implantation of hydrogen. The buffer region 20 may serve as a field stop layer to prevent a depletion layer extending from the lower end of the base region 14 from reaching a P+ type collector region 22.

The P+ type collector region 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron. The element serving as the acceptor is not limited to the example described above.

The collector region 22 is exposed on the lower surface 23 of the semiconductor substrate 10 and connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 and reaches the drift region 18. In the region where at least any of the emitter region 12, the contact region 15, or the accumulation region 16 is provided, each trench portion also penetrates these doping regions and reaches the drift region 18. The configuration of the trench portion penetrating the doping region is not limited to that manufactured in the order of forming the doping region and then forming the trench portion. The configuration of the trench portion penetrating the doping region also includes a configuration of the doping region being formed between the trench portions after forming the trench portion.

The gate trench portion 40 has a gate trench, a gate dielectric film 42, and a gate conductive portion 44 provided on the upper surface 21 of the semiconductor substrate 10. The gate dielectric film 42 is provided to cover the inner wall of the gate trench. The gate dielectric film 42 may be formed by oxidizing or nitriding a semiconductor on the inner wall of the gate trench. The gate conductive portion 44 is provided farther inward than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner 130. When a predetermined gate voltage is applied to the gate conductive portion 44, a channel is formed by an electron inversion layer in a surface layer of the base region 14 at a boundary in contact with the gate trench portion 40.

The dummy trench portion 30 may have the same structure as the gate trench portion 40 in the cross section. The dummy trench portion 30 has a dummy trench, a dummy dielectric film 32, and a dummy conductive portion 34 provided on the upper surface 21 of the semiconductor substrate 10. The dummy conductive portion 34 is electrically connected to the emitter electrode 52. The dummy dielectric film 32 is provided to cover the inner wall of the dummy trench. The dummy conductive portion 34 is provided inside the dummy trench and is provided farther inward than the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. Note that the bottoms of the dummy trench portion 30 and the gate trench portion 40 may be formed in a curved surface shape (a curved shape in the cross section) convexly downward.

The semiconductor device 100 of the present example is an IGBT and is operated as a switching element in combination with a diode such as an FWD. According to its use, it is necessary to suppress the slope of the reverse recovery voltage of the FWD at low current and reduce noise. In a semiconductor device 200 according to a comparative example, when an external gate resistance connected to the gate conductive portion 44 is increased to suppress the slope of the reverse recovery voltage, the speed of turn-on of the IGBT at rated current slows down and turn-on loss increases.

Meanwhile, in the semiconductor device 100 according to the present example, a second conductivity type bottom region is provided at the bottom of the trench portion. In the present example, the center portion 170 is provided with the second conductivity type active side bottom region 182 in the bottom of the trench portion. The active side bottom region 182 of the present example is of a P– type. The active side bottom region 182 convers the bottom of the trench portion. The active side bottom region 182 is provided across the bottoms of at least two trench portions. The active side bottom region 182 may be provided below the base region 14. By providing the second conductivity type active side bottom region 182, it is easier to control the slope of the reverse recovery voltage of the FWD. Accordingly, the turn-on loss can be further reduced. By providing the active side bottom region 182, breakdown voltage can be improved.

The circumferential portion 180 is provided with the second conductivity type circumferential side bottom region 184 in the bottom of the trench portion. In the present example, the circumferential side bottom region 184 is of a P– type. The circumferential side bottom region 184 covers the bottom of the trench portion. The circumferential side bottom region 184 may be provided facing the active side bottom region 182. That is, the circumferential side bottom region 184 may be provided at the same depth as the active side bottom region 182 in the depth direction of the semiconductor substrate 10. The circumferential side bottom region 184 is electrically connected to the circumferential well region 11. In the present example, the circumferential side bottom region 184 is directly connected to the circumferential well region 11. Accordingly, it is possible to reduce electric field strength of the boundary between the circumferential well region 11 and the circumferential side bottom region 184 and improve avalanche resistance at turn-off.

In the present example, the active side bottom region 182 and the circumferential side bottom region 184 are provided apart from each other. That is, in at least a part of the circumferential portion 180, the bottom region is not provided. By providing the active side bottom region 182 and the circumferential side bottom region 184 apart from each other, it is possible to prevent the active side bottom region 182 and the circumferential well region 11 from having the same potential. Accordingly, it is possible to prevent the semiconductor device 100 from failing to operate. The active side bottom region 182 may be electrically floating. The active side bottom region 182 electrically floating means that it is not electrically connected to any electrode. The active side bottom region 182 may not be partially provided in the active portion 160. That is, the active side bottom region 182 may not be provided in the entire active portion 160.

The active side bottom region 182 may also be provided in the circumferential portion 180. That is, the active side bottom region 182 may be provided wider than the range in which the emitter region 12 is provided in the array direction of the trench portions. The active side bottom region 182 may be at least partially provided in the circumferential portion 180. In the manufacturing process of providing the active side bottom region 182, the concentration of the base region 14 changes and a threshold of the semiconductor device 100 becomes varied. Accordingly, by providing the emitter region 12 only in a place where the concentration of the base region 14 is changed, variation of the threshold can be suppressed. When the active side bottom region 182 is provided in the entire circumferential portion 180, the active side bottom region 182 becomes connected to the circumferential well region 11. Accordingly, the active side bottom region 182 is preferably not provided at least partially on the circumferential portion 180.

The bottom region may terminate at the bottom of the trench portion. That is, the bottom region does not terminate at the mesa portion 60. In the present example, the active side bottom region 182 terminates at the bottom of the trench portion. The circumferential side bottom region 184 terminates at the bottom of the trench portion. By terminating at the bottom of the trench portion, the bottom region can prevent electric field distribution from becoming steep.

Impurity concentrations of the active side bottom region 182 and the circumferential side bottom region 184 may be the same. By making the impurity concentrations of the active side bottom region 182 and the circumferential side bottom region 184 the same, the manufacturing process can be made the same. The impurity concentration of the circumferential side bottom region 184 may be larger than the impurity concentration of the active side bottom region 182. By making the impurity concentration of the circumferential side bottom region 184 to be larger than the impurity concentration of the active side bottom region 182, an effect of reducing a local electric field strength increases. The impurity concentration of the circumferential well region 11 may be larger than the impurity concentration of the circumferential side bottom region 184. By making the impurity concentration of the circumferential well region 11 to be larger than the impurity concentration of the circumferential side bottom region 184, it is possible to prevent electric field distribution from becoming steep. As an example, a peak of the impurity concentration of each bottom region is $4.0 \times 10^{15}$ atoms/cm$^3$. The peak of the impurity concentration of each bottom region may be $3.0 \times 10^{14}$ atoms/cm$^3$ or more and $3.0 \times 10^{16}$ atoms/cm$^3$ or less. As an example, a dosage of ions implanted in each bottom region may be $1.0 \times 10^{11}$ ions/cm$^2$ or more and $1.0 \times 10^{13}$ ions/cm$^2$ or less.

A distance L in the array direction of the trench portions of the active side bottom region 182 and the circumferential side bottom region 184 may be a pitch width W1 of the trench portion or more. The pitch width W1 of the trench portion is a distance from the center of the conductive portion of the trench portion to the center of the conductive portion of an adjacent trench portion. By making the distance L in the array direction of the trench portion of the active side bottom region 182 and the circumferential side bottom region 184 to be the pitch width W1 of the trench portion or more, the active side bottom region 182 and the circumferential side bottom region 184 become close, and it is possible to prevent the semiconductor device 100 from failing to operate. The distance L in the array direction of the trench portion of the active side bottom region 182 and the circumferential side bottom region 184 may preferably be twice or more the pitch width W1 of the trench portion. The distance L in the array direction of the trench portion of the active side bottom region 182 and the circumferential side bottom region 184 may be twenty times or less the pitch width W1 of the trench portion. In this manner, the range in which the active side bottom region 182 is provided can be widened. The distance L in the array direction of the trench portion of the active side bottom region 182 and the circumferential side bottom region 184 may preferably be six times or less the pitch width W1 of the trench portion. In the present example, the distance L in the array direction of the trench portion of the active side bottom region 182 and the circumferential side bottom region 184 is five times the pitch width W1 of the trench portion. The distance L may be ten times or more and fifteen times or less the pitch width W1 of the trench portion.

The distance L in the array direction of the active side bottom region 182 and the circumferential side bottom region 184 may be 2 μm or more. The distance L in the array direction of the active side bottom region 182 and the circumferential side bottom region 184 may preferably be 4 μm or more. The distance L in the array direction of the active side bottom region 182 and the circumferential side bottom region 184 may be 40 μm or less. The distance L in the array direction of the active side bottom region 182 and the circumferential side bottom region 184 may preferably be 12 μm or less. As an example, the distance L in the array direction of the active side bottom region 182 and the circumferential side bottom region 184 is 10 μm. The distance L may be 30 μm or more and 35 μm or less.

The circumferential side bottom region 184 may be provided in a range that is five times or less the pitch width W1 of the trench portion from the circumferential well region 11 in the array direction of the trench portion. In the present example, the circumferential side bottom region 184 is provided in a range that is three times or less the pitch width W1 of the trench portion from the circumferential well region 11 in the array direction of the trench portion. Even in such a configuration, it is possible to sufficiently separate the active side bottom region 182 and the circumferential side bottom region 184 and prevent the semiconductor device 100 from failing to operate. The distance L in the array direction of the active side bottom region 182 and the circumferential side bottom region 184 may be larger than a width W2 in which the circumferential side bottom region 184 is provided. Note that, as an example, the width W2 in which the circumferential side bottom region 184 is provided is 7 μm.

The gate trench portion 40 is preferably provided between the active side bottom region 182 and the circumferential side bottom region 184 in the depth direction of the semiconductor substrate 10. In the present example, one gate trench portion 40 is provided between the active side bottom region 182 and the circumferential side bottom region 184 in the depth direction of the semiconductor substrate 10. With the gate trench portion 40 between the active side bottom region 182 and the circumferential side bottom region 184 in the depth direction of the semiconductor substrate 10, an effect from a ground potential can be suppressed.

In a case where both the active side bottom region 182 and the circumferential side bottom region 184 terminate at the gate trench portion 40, when a ratio of the gate trench portion 40 and the dummy trench portion 30 is one to two, the distance L of the active side bottom region 182 and the circumferential side bottom region 184 in the array direction of the trench portion may be three times or more the pitch width W1 of the trench portion. In this case, when the ratio of the gate trench portion 40 and the dummy trench portion 30 is one to X, the distance L may be one+X times or more. In a case where one of the active side bottom region 182 and the circumferential side bottom region 184 terminates at the gate trench portion 40, when the other one terminates at the dummy trench portion 30, the distance L of the active side bottom region 182 and the circumferential side bottom region 184 in the array direction of the trench portion may be the pitch width W1 of the trench portion or more. In a case where both the active side bottom region 182 and the circumferential side bottom region 184 terminate at the dummy trench portion 30, when the ratio of the gate trench portion 40 and the dummy trench portion 30 is one to two, the distance L of the active side bottom region 182 and the circumferential side bottom region 184 in the array direction of the trench portion may be twice or more the pitch width W1 of the trench portion. In this case, when the ratio of the gate trench portion 40 and the dummy trench portion 30 is one to X, the distance L may be X times or more.

The accumulation region 16 is preferably provided wider than the active side bottom region 182. In the present example, the accumulation region 16 is provided wider than the active side bottom region 182 in the X axis direction. With such a configuration, it is possible to easily form the accumulation region 16 and the active side bottom region 182. The accumulation region 16 preferably does not overlap with the circumferential side bottom region 184 in the depth direction.

Figure 4:
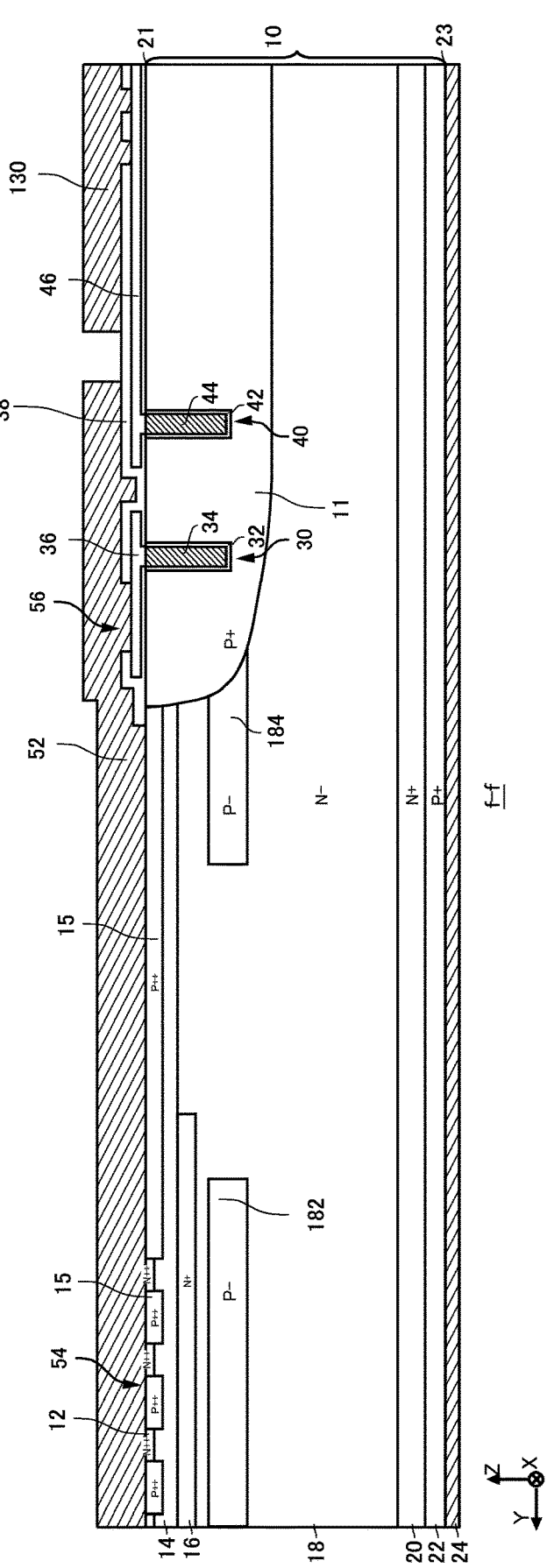
FIG. 4 is a drawing showing an example of the cross section f-f in FIG. 2.

FIG. 4 is a drawing showing an example of a cross section f-f in FIG. 2. The cross section f-f is a Y-Z plane that passes through the edge portion 41 of the gate trench portion 40 and the edge portion 31 of the dummy trench portion 30. The dimensions in FIG. 4 do not necessarily match the dimensions in FIG. 2. The semiconductor device 100 of the present example has the semiconductor substrate 10, the interlayer dielectric film 38, the emitter electrode 52, the collector electrode 24, and the gate runner 130, in the cross section.

In the cross section, the gate trench portion 40 connects with the gate runner 130. In the cross section, the dummy trench portion 30 connects with the emitter electrode 52 via a contact hole 56. A dummy polysilicon 36 may be provided below the emitter electrode 52. Similarly to FIG. 3, the circumferential side bottom region 184 may be provided at the same depth as the active side bottom region 182 in the depth direction of the semiconductor substrate 10 in FIG. 4.

Figure 5:
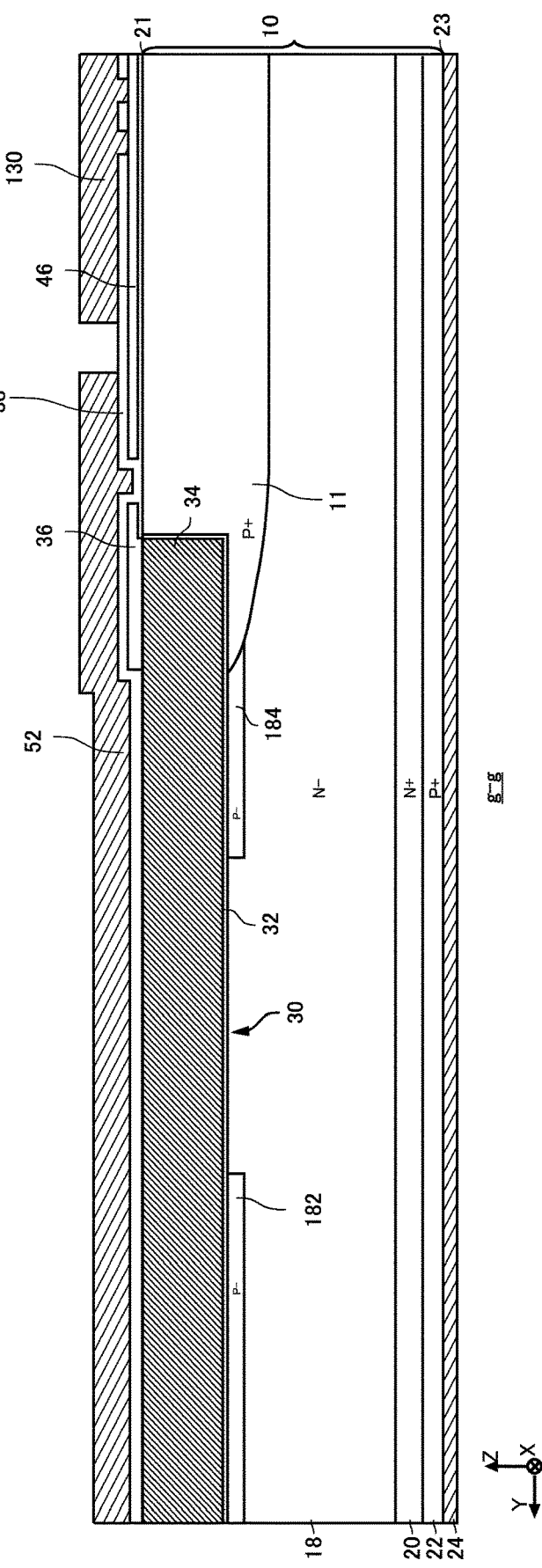
FIG. 5 is a drawing showing an example of the cross section g-g in FIG. 2.

FIG. 5 is a drawing showing an example of a cross section g-g in FIG. 2. The cross section g-g is a Y-Z plane that passes through the linear portion 29 of the dummy trench portion 30. The dimensions in FIG. 5 do not necessarily match the dimensions in FIG. 2. The semiconductor device 100 of the present example has the semiconductor substrate 10, the interlayer dielectric film 38, the emitter electrode 52, the collector electrode 24, and the gate runner 130 in the cross section. In FIG. 5, the interlayer dielectric film 38 is provided between the emitter electrode 52 and the dummy trench portion 30. Similarly to FIG. 3, the circumferential side bottom region 184 may be provided at the same depth as the active side bottom region 182 in the depth direction of the semiconductor substrate 10 in FIG. 5.

Figure 6:
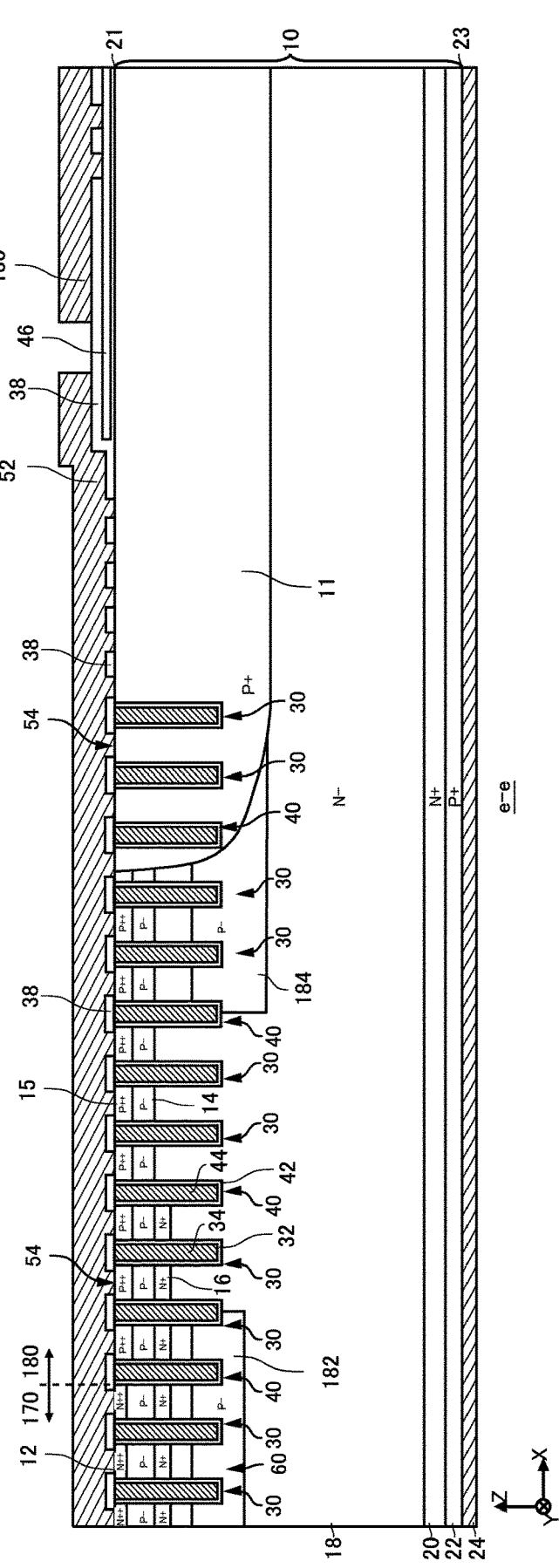
FIG. 6 is a drawing showing another example of the cross section e-e in FIG. 2.

FIG. 6 is a drawing showing another example of the cross section e-e in FIG. 2. FIG. 6 is different from FIG. 2 in that the circumferential side bottom region 184 is provided wider than the active side bottom region 182 in the depth direction of the semiconductor substrate 10. Other configurations of FIG. 6 may be the same as FIG. 2. In the present example, the circumferential side bottom region 184 is provided wider on the lower surface 23 side in comparison to the active side bottom region 182 and has approximately the same depth as the circumferential well region 11. By providing the circumferential side bottom region 184 to be wider than the active side bottom region 182, the electric field distribution can be adjusted.

Figure 7:
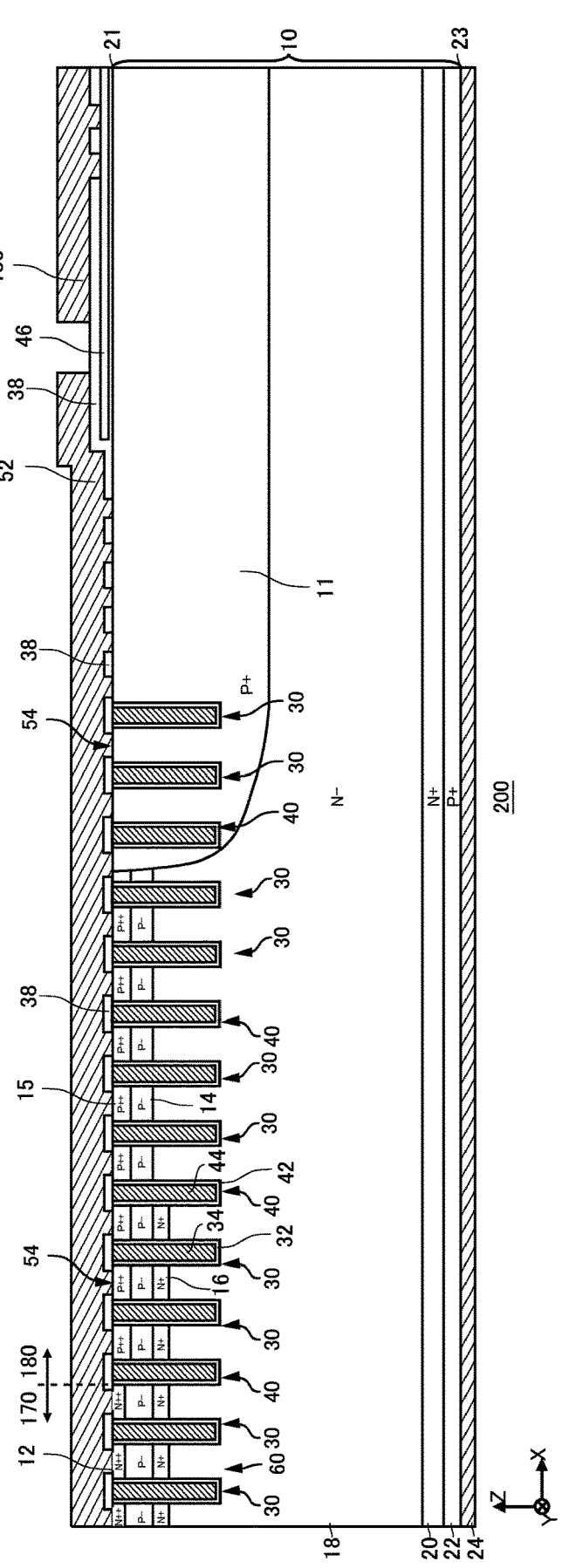
FIG. 7 is a drawing showing an example of a semiconductor device 200 according to a comparative example.

FIG. 7 is a drawing showing an example of the semiconductor device 200 according to a comparative example. FIG. 7 is different from FIG. 3 in that the active side bottom region 182 and the circumferential side bottom region 184 are not provided. Other configurations of FIG. 7 may be the same as FIG. 3.

Figure 8:
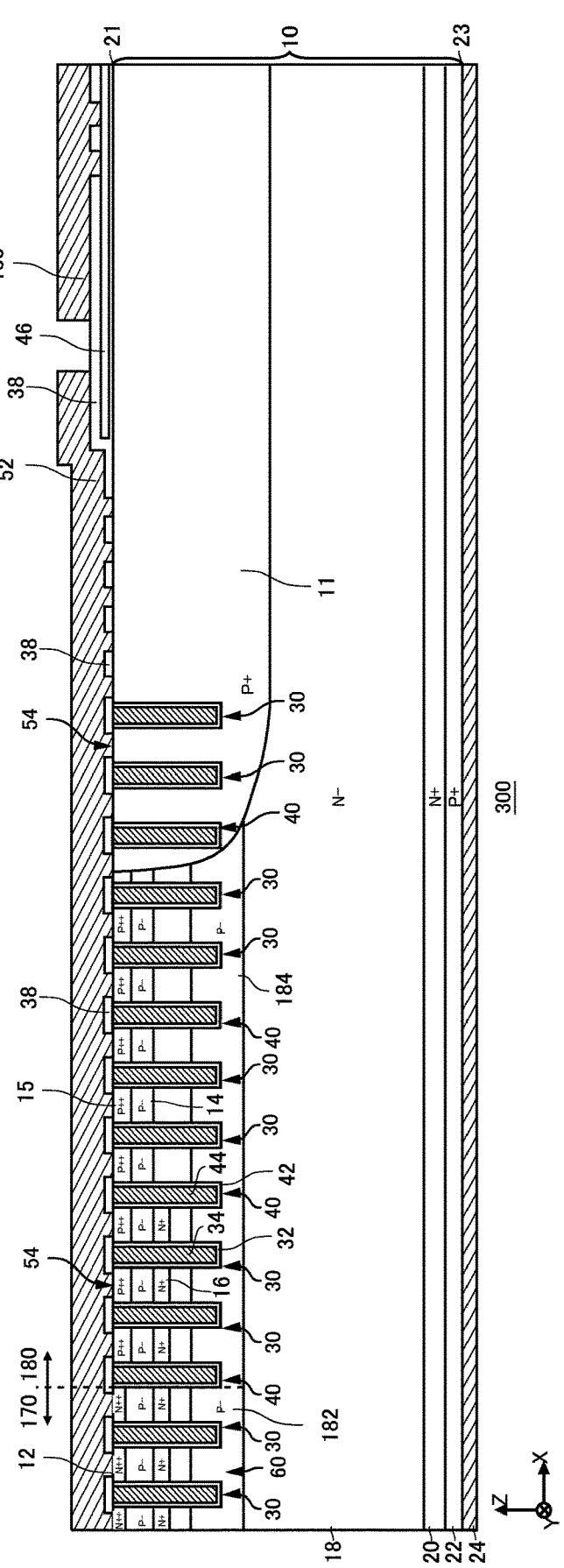
FIG. 8 is a drawing showing an example of a semiconductor device 300 according to comparative example.

FIG. 8 is a drawing showing an example of a semiconductor device 300 according to a comparative example. FIG. 8 is different from FIG. 3 in that the active side bottom region 182 and the circumferential side bottom region 184 are connected. The other configurations of FIG. 8 may be the same as FIG. 3. In the case of the present example, the boundary between the active side bottom region 182 and the circumferential side bottom region 184 may be the boundary between the center portion 170 and the circumferential portion 180.

Figure 9:
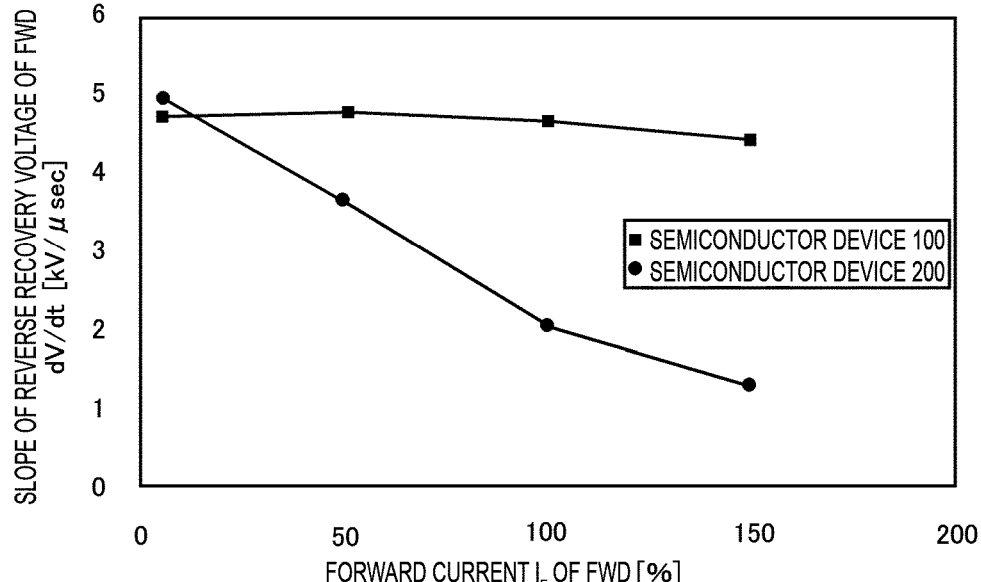
FIG. 9 is a drawing showing a relationship between forward current and slope of a reverse recovery voltage of an FWD at room temperature.

FIG. 9 is a drawing showing a relationship between forward current and slope of a reverse recovery voltage of an FWD at room temperature. It is shown as a ratio when the rated current of the forward current is one. The semiconductor device 100 and the semiconductor device 200 of FIG. 9 adjust an external gate resistance so that slope of reverse recovery voltage when a forward current is 5 to 10% (at low current) is the same (approximately 5 kV/μsec). By FIG. 9, the semiconductor device 100 can maintain the same degree of slope of the reverse recovery voltage of the FWD even when the forward current is varied compared to the semiconductor device 200. Accordingly, since it is possible to maintain a turn-on speed on the IGBT side when the forward current is 100% (at rated current) as fast as when the forward current is 5 to 10% (at low current) without slowing down, turn-on loss can be reduced.

Figure 10:
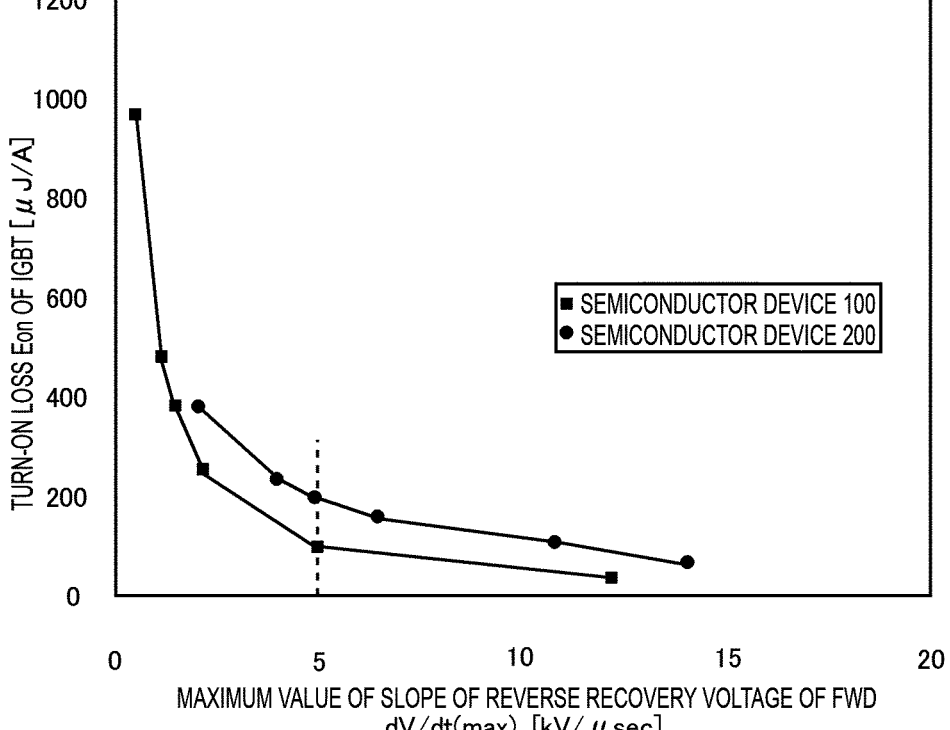
FIG. 10 is a drawing showing a relationship between a maximum value of a slope of the reverse recovery voltage of the FWD (at low current of room temperature) and a turn-on loss (at rated current of high temperature).

FIG. 10 is a drawing showing a relationship between a maximum value of a slope of the reverse recovery voltage of the FWD (at low current of room temperature) and a turn-on loss (at rated current of high temperature). FIG. 10 can be obtained by plotting, one to one, a maximum value of the slope of reverse recovery voltage on the FWD side and the turn-on loss on the IGBT side by varying the external gate resistance. By FIG. 10, when the maximum value of the slope of the reverse recovery voltage of the FWD is 5 kV/psec and the semiconductor device 100 and the semiconductor device 200 are compared, the turn-on loss can be reduced by about 50 percent.

Figure 11:
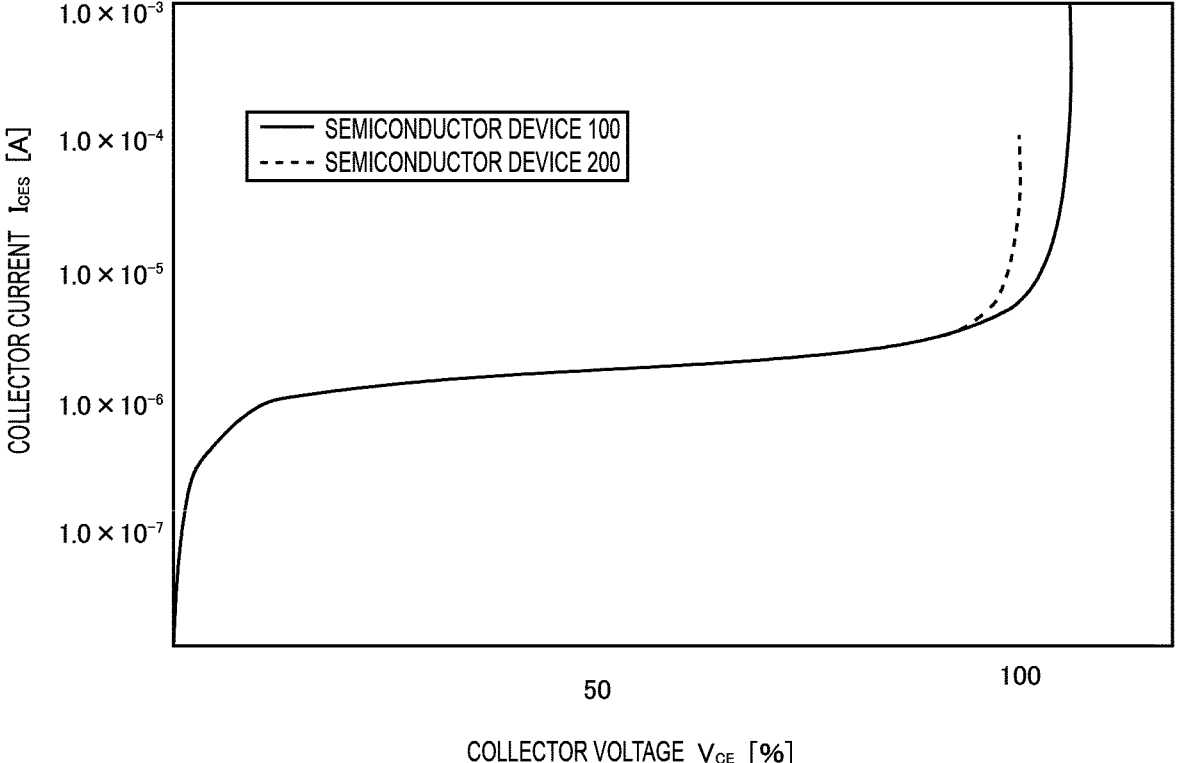
FIG. 11 is a drawing showing IV characteristics of a collector current and collector voltage when a gate voltage of the semiconductor device 100 and the semiconductor device 200 is 0 V (OFF).
Figure 12:
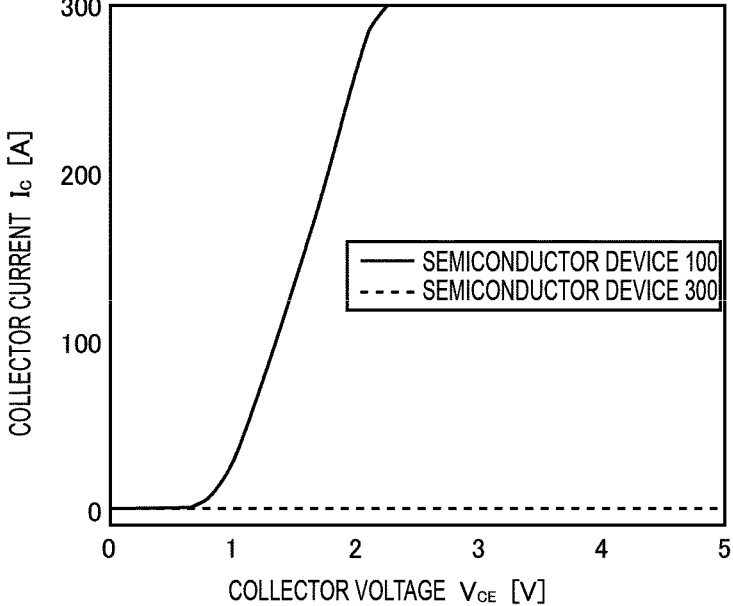
FIG. 12 is a drawing showing IV characteristics of a collector current and collector voltage when a gate voltage of the semiconductor device 100 and the semiconductor device 300 is 15 V (ON).

FIG. 11 is a drawing showing IV characteristics of collector current and collector voltage when gate voltage of the semiconductor device 100 and the semiconductor device 200 is 0 V (OFF). The collector voltage is shown in a ratio when the semiconductor device 200 is one. As shown in FIG. 11, since the semiconductor device 100 has the bottom region, compared to the semiconductor device 200, it can improve breakdown voltage. FIG. 12 is a drawing showing IV characteristics of collector current and collector voltage of the semiconductor device 100 and the semiconductor device 300 when gate voltage is 15 V (ON). As shown in FIG. 12, when the active side bottom region 182 and the circumferential side bottom region 184 are connected, the semiconductor device 300 does not operate.

Figure 13:
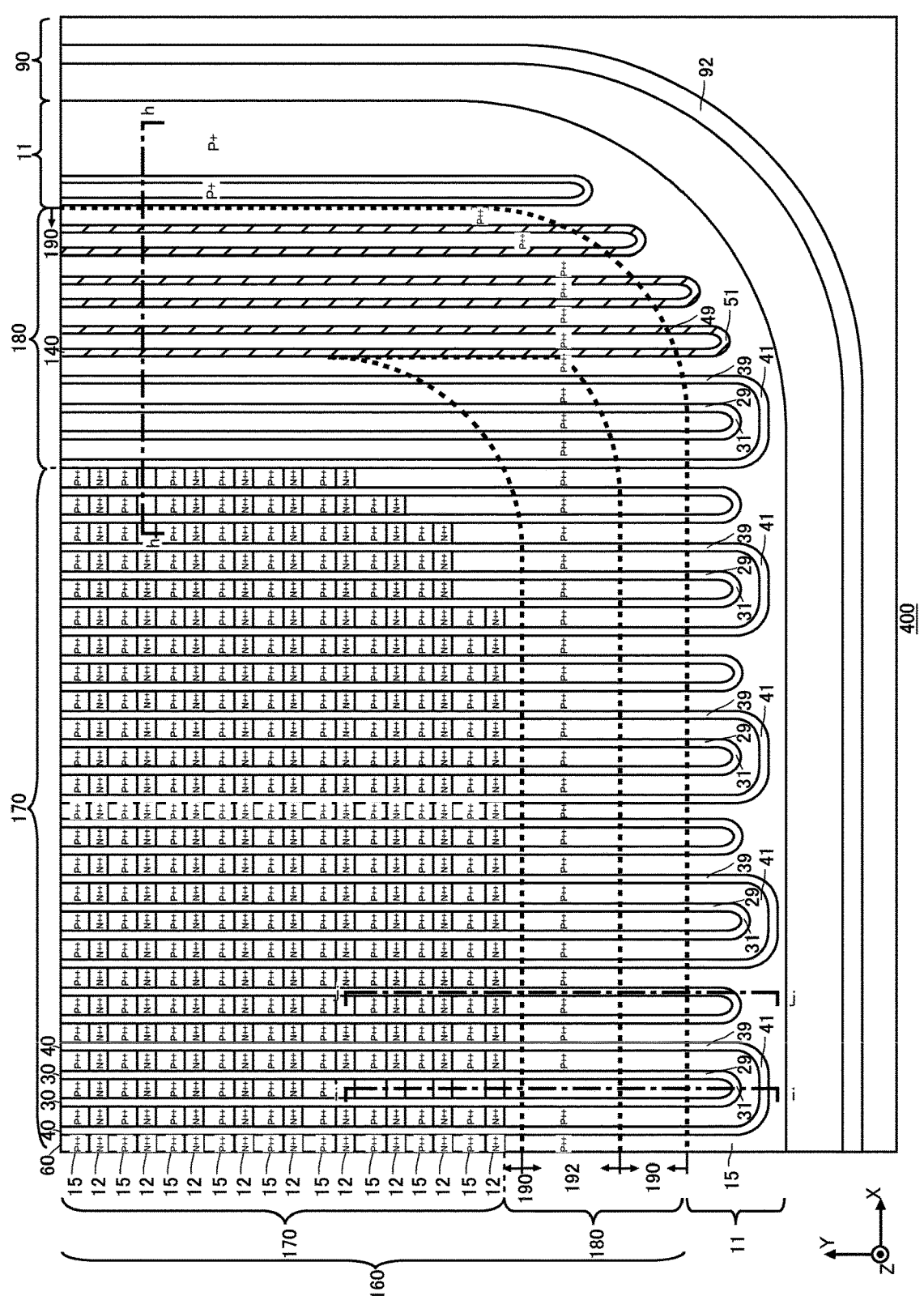
FIG. 13 is a top view showing an example of a semiconductor device 400 according to another embodiment.

FIG. 13 is a top view showing an example of a semiconductor device 400 according to another embodiment. The semiconductor device 400 of FIG. 13 is different from the semiconductor device 100 of FIG. 2 in the disposition of a bottom region 190. The semiconductor device 400 of FIG. 13 is different from the semiconductor device 100 of FIG. 2 in that a circumferential side deepening trench portion 140 is provided. Other configurations of the semiconductor device 400 of FIG. 13 may be the same as those of the semiconductor device 100 of FIG. 2.

FIG. 13 shows the bottom region 190 provided in the semiconductor substrate 10. The bottom region 190 has the active side bottom region 182 (not shown in FIG. 13), the circumferential side bottom region 184 (not shown in FIG. 13), and a circumferential side intermediate bottom region that is described below.

The bottom region 190 may not be partially provided in the active portion 160. In the present example, the bottom region 190 is not partially provided in the circumferential portion 180. The region in which the bottom region 190 is not provided is a bottomless region 192. The bottomless region 192 is provided at the same depth as the bottom region 190 in the depth direction of the semiconductor substrate 10. The bottomless region 192 is provided with the first conductivity type drift region 18. In the present example, the bottomless region 192 is provided so as to be in contact with the circumferential side deepening trench portion 140 provided closest to the center portion 170 in the array direction of the trench portion (X axis direction). By disposing the bottomless region 192 in this manner, it is possible to prevent the bottom region 190 provided in the center portion 170 (active side bottom region 182) and the bottom region 190 provided in the circumferential portion 180 (circumferential side bottom region 184) from connecting in the extending direction of the trench portion (Y axis direction). Note that the bottomless region 192 may be partially overlapped with the circumferential side deepening trench portion 140.

The transistor portion 70 has a plurality of deepening trench portions arranged in an array direction. The trench portion has the deepening trench portion. In the present example, the deepening trench portion is provided in the active portion 160 on the upper surface of the semiconductor substrate 10. The deepening trench portion in FIG. 13 is provided in the circumferential portion 180. In FIG. 13, the deepening trench portion provided in the circumferential portion 180 is the circumferential side deepening trench portion 140. The circumferential side deepening trench portion 140 may be provided in the circumferential well region 11. The circumferential side deepening trench portion 140 may not be provided in the center portion 170. In FIG. 13, the circumferential side deepening trench portion 140 is shown with hatching.

The circumferential side deepening trench portion 140 has a trench, a dielectric film, and a conductive portion provided on the upper surface 21 of the semiconductor substrate 10. The circumferential side deepening trench portion 140 may function as a dummy trench portion. The conductive portion of the circumferential side deepening trench portion 140 may be connected to the emitter electrode 52. The circumferential side deepening trench portion 140 may function as a gate trench portion. The conductive portion of the circumferential side deepening trench portion 140 may be connected to the gate runner 130.

The circumferential side deepening trench portion 140 may have two linear portions 49 extending along the extending direction perpendicular to the array direction (trench portions linear along the extending direction). The circumferential side deepening trench portion 140 may have an edge portion 51 that connects to the two linear portions 49. Preferably, at least a part of the edge portion 51 is provided in a curved shape in a top view. By connecting between ends of the two linear portions 49 in the Y axis direction by the edge portion 51, it is possible to reduce electric field strength at the ends of the linear portions 49.

Figure 14:
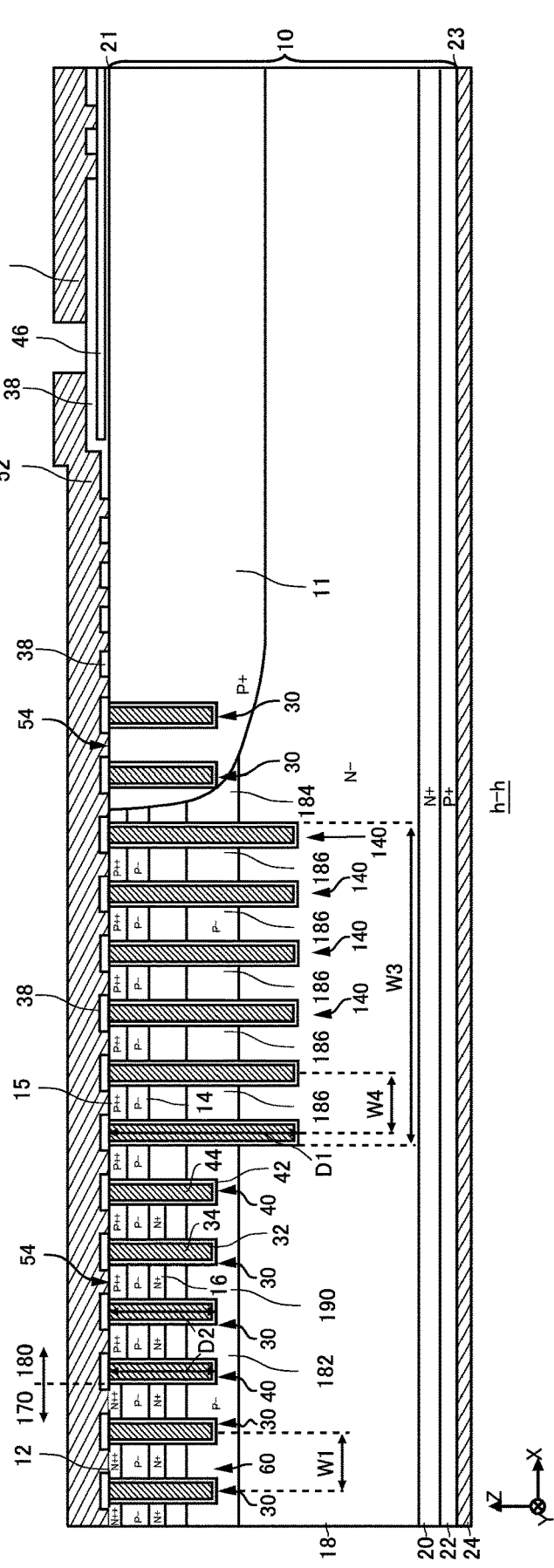
FIG. 14 is a drawing showing an example of a cross section h-h in FIG. 13.

FIG. 14 is a drawing showing an example of a cross section h-h in FIG. 13. The cross section h-h is an X-Z plane that passes through the emitter region 12 of the center portion 170. Note that the dimensions in FIG. 14 do not necessarily match the dimensions in FIG. 13. In the cross section, the semiconductor device 400 of the present example has the semiconductor substrate 10, the interlayer dielectric film 38, the emitter electrode 52, the collector electrode 24, and the gate runner 130.

The circumferential side deepening trench portion 140 is formed deeper than the bottom region 190. The circumferential side deepening trench portion 140 may be formed deeper than the gate trench portion 40. The circumferential side deepening trench portion 140 may be formed deeper than the dummy trench portion 30. The circumferential side deepening trench portion 140 may be formed deeper than the circumferential well region 11.

In the present example, since the circumferential side deepening trench portion 140 is formed deeper than the bottom region 190, the bottom region 190 can be divided. In FIG. 14, the bottom region 190 provided closer to the center portion 170 than the circumferential side deepening trench portions 140 in the array direction of the trench portions is the active side bottom region 182. In FIG. 14, the bottom region 190 provided in between the respective circumferential side deepening trench portions 140 in the array direction of the trench portions is a circumferential side intermediate bottom region 186. In FIG. 14, the bottom region 190 provided between the circumferential side deepening trench portions 140 and the circumferential well region 11 in the array direction of the trench portions is the circumferential side bottom region 184. The circumferential side deepening trench portion 140 is provided between the active side bottom region 182 and the circumferential side bottom region 184 in the array direction of the trench portions in the circumferential portion 180. The circumferential side deepening trench portion 140 is formed deeper than the active side bottom region 182. The circumferential side deepening trench portion 140 is formed deeper than the circumferential side bottom region 184. In the present example, the active side bottom region 182 can be separated from the circumferential side bottom region 184 and the circumferential side intermediate bottom region 186, and the active side bottom region 182 can be made to be electrically floating. Accordingly, the slope of reverse recovery voltage can be improved. By providing the circumferential side bottom region 184 and the circumferential side intermediate bottom region 186, unbalanced breakdown voltage of the semiconductor device 400 can be eliminated.

The impurity concentrations of the active side bottom region 182, the circumferential side bottom region 184, and the circumferential side intermediate bottom region 186 may be the same. By making the impurity concentrations of the active side bottom region 182, the circumferential side bottom region 184, and the circumferential side intermediate bottom region 186 the same, the manufacturing process can be made the same. The impurity concentrations of the active side bottom region 182, the circumferential side bottom region 184, and the circumferential side intermediate bottom region 186 may each be different. The impurity concentrations of the active side bottom region 182 and the circumferential side bottom region 184 may be the same, and only the impurity concentrations of the circumferential side intermediate bottom region 186 may be different from the others.

A width W3 in which the circumferential side deepening trench portion 140 is provided in the array direction of the trench portions may be 5.0 μm or more. The width W3 in which the circumferential side deepening trench portion 140 is provided in the array direction of the trench portions may be the pitch width W1 of the trench portions other than the circumferential side deepening trench portion 140 or more. The pitch width W1 of the trench portions other than the circumferential side deepening trench portion 140 may be the same as the pitch width W1 of the trench portion of FIG. 3. The width W3 at which the circumferential side deepening trench portion 140 is provided in the array direction of the trench portions may be twice or more of the pitch width W1 of the trench portions other than the circumferential side deepening trench portion 140.

A pitch width W4 of the circumferential side deepening trench portion 140 may be the same as the pitch width W1 of the trench portions other than the circumferential side deepening trench portion 140. The pitch width W4 of the circumferential side deepening trench portion 140 is a distance from a center of the conductive portion of the circumferential side deepening trench portion 140 to a center of the conductive portion of an adjacent circumferential side deepening trench portion 140. The pitch width W4 of the circumferential side deepening trench portion 140 may be the pitch width W1 of the trench portions other than the circumferential side deepening trench portion 140 or less. By making the pitch width W4 of the circumferential side deepening trench portion 140 to be the pitch width W1 of the trench portions other than the circumferential side deepening trench portion 140 or less, breakdown voltage can be improved.

In the present example, the circumferential side deepening trench portion 140 is formed deeper than the circumferential well region 11. That is, a depth D1 of the circumferential side deepening trench portion 140 may be a depth D2 of the trench portions other than the circumferential side deepening trench portion 140 or more. Note that if the depth of the circumferential side deepening trench portion 140 is too deep, there may be a case where breakdown voltage decreases. Accordingly, the depth D1 of the circumferential side deepening trench portion 140 is preferably made to be twice or less of the depth D2 of the trench portions other than the circumferential side deepening trench portion 140.

Note that the circumferential side intermediate bottom region 186 may not be provided. That is, the bottomless region 192 may be provided in between the respective circumferential side deepening trench portions 140 in the array direction of the trench portions. By not providing the circumferential side intermediate bottom region 186, the active side bottom region 182 and the circumferential side bottom region 184 can be easily separated.

Figure 15:
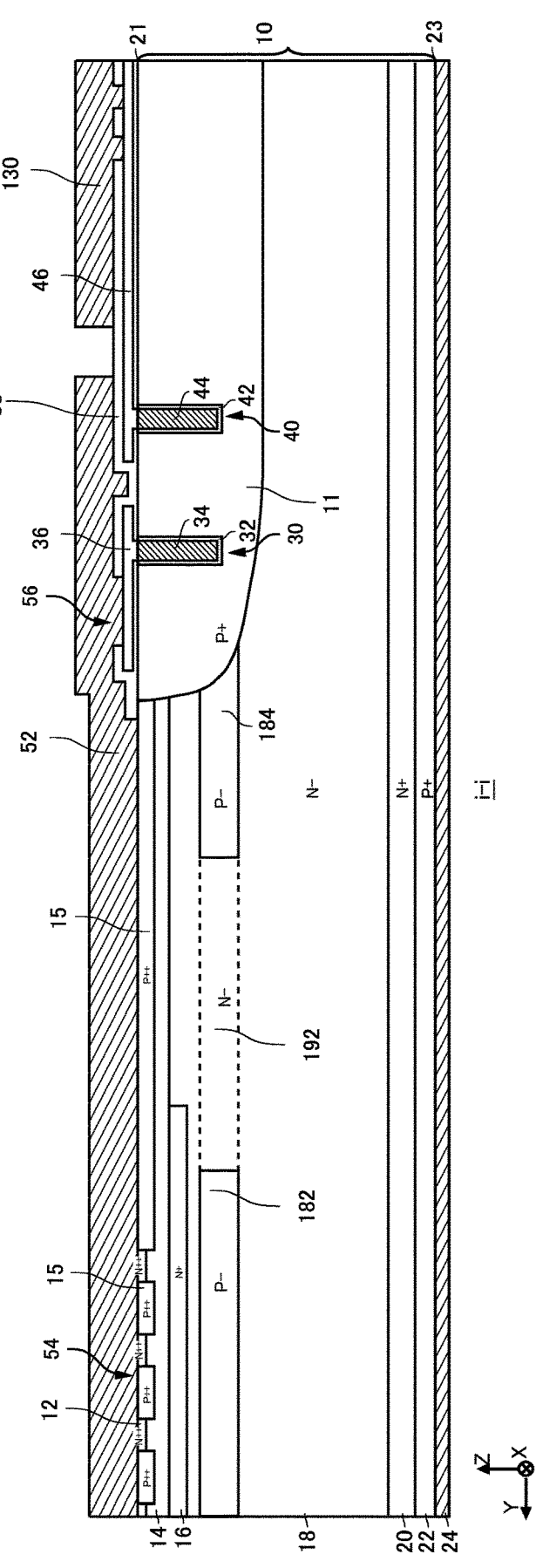
FIG. 15 is a drawing showing an example of a cross section i-i in FIG. 13.

FIG. 15 is a drawing showing an example of a cross section i-i in FIG. 13. The cross section i-l is a Y-Z plane that passes through the edge portion 41 of the gate trench portion 40 and the edge portion 31 of the dummy trench portion 30. The dimensions in FIG. 15 do not necessarily match the dimensions in FIG. 13. In the cross section, the semiconductor device 400 of the present example has the semiconductor substrate 10, the interlayer dielectric film 38, the emitter electrode 52, the collector electrode 24, and the gate runner 130. FIG. 15 is the same as FIG. 4 except that the bottomless region 192 is shown with a dotted line.

Figure 16:
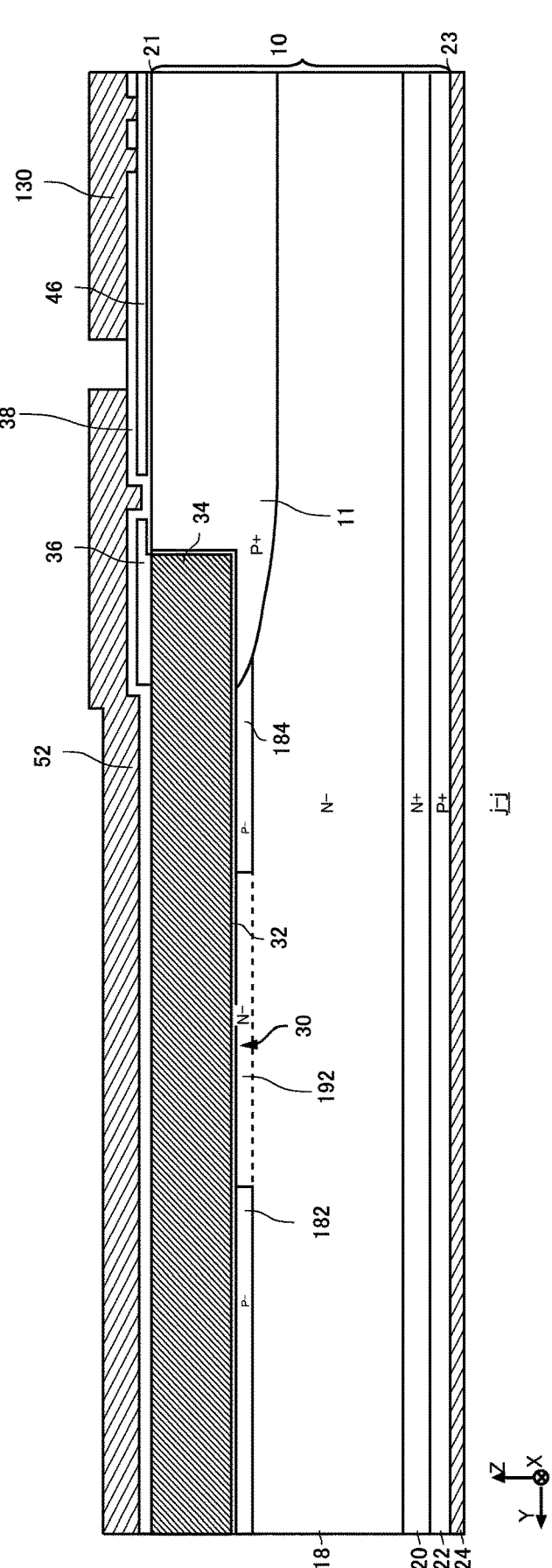
FIG. 16 is a drawing showing an example of a cross section j-j in FIG. 13.

FIG. 16 is a drawing showing an example of a cross section j-j in FIG. 13. The cross section j-j is a Y-Z plane that passes through the linear portion 29 of the dummy trench portion 30. Note that the dimensions in FIG. 16 do not necessarily match the dimensions in FIG. 13. In the cross section, the semiconductor device 400 in the present example has the semiconductor substrate 10, the interlayer dielectric film 38, the emitter electrode 52, the collector electrode 24, and the gate runner 130. FIG. 16 is the same as FIG. 5 except that the bottomless region 192 is shown with a dotted line.

Figure 17:
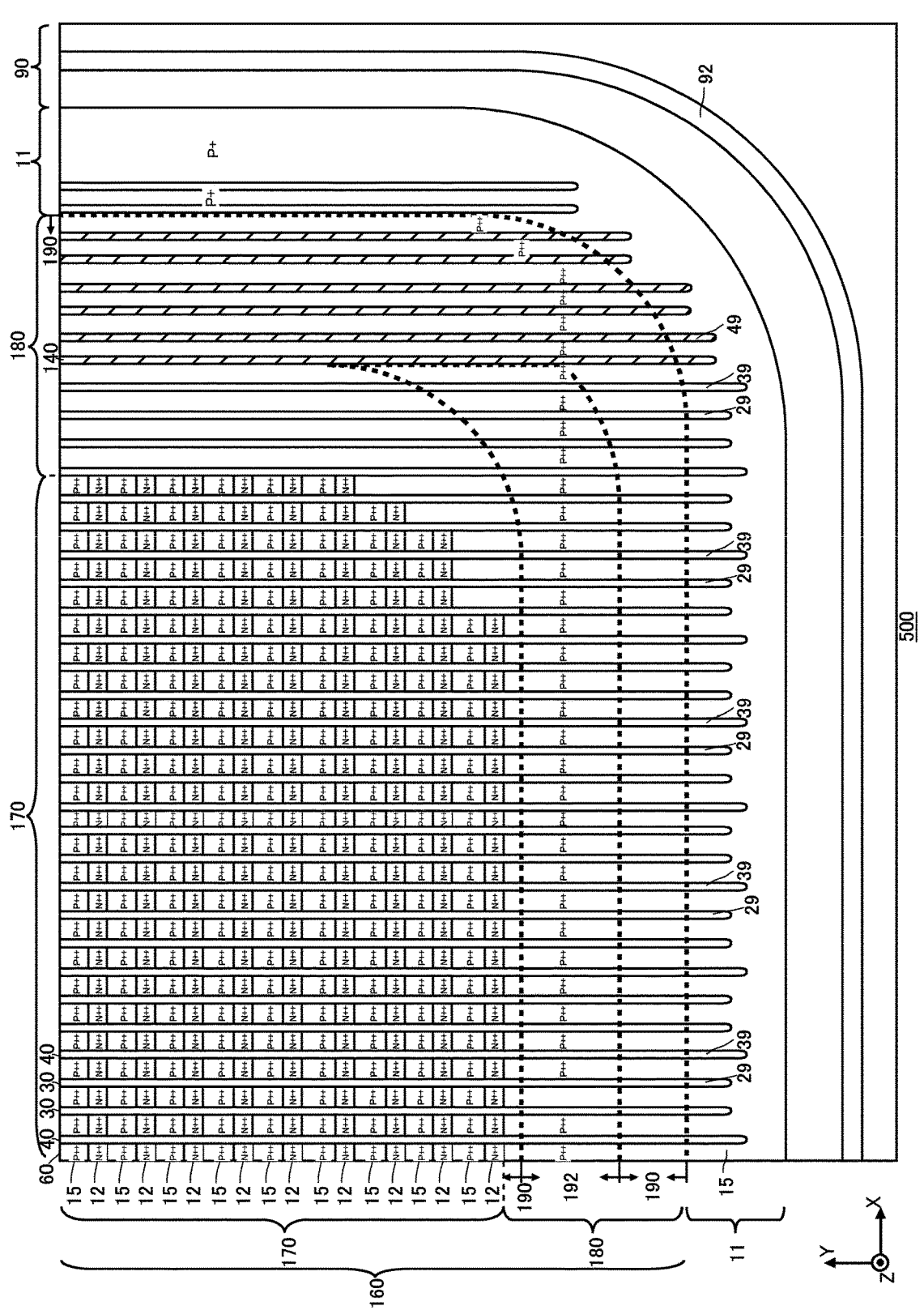
FIG. 17 is a top view showing an example of a semiconductor device 500 according to another embodiment.

FIG. 17 is a top view showing an example of a semiconductor device 500 according to another embodiment. The semiconductor device 500 of FIG. 17 has a different trench portion structure from that of the semiconductor device 400 of FIG. 13. Other configurations of the semiconductor device 500 of FIG. 17 may be the same as those of the semiconductor device 400 of FIG. 13.

In the present example, each trench portions does not have an edge portion. That is, the gate trench portion 40 may not have the edge portion 41. The gate trench portion 40 may only have the linear portion 39. The dummy trench portion 30 may not have the edge portion 31. The dummy trench portion 30 may only have the linear portion 29. The circumferential side deepening trench portion 140 may not have the edge portion 51. The circumferential side deepening trench portion 140 may only have the linear portion 49. Since each trench portion does not have the edge portion, degree of freedom of the layout of the trench portions can be increased.

Figure 18:
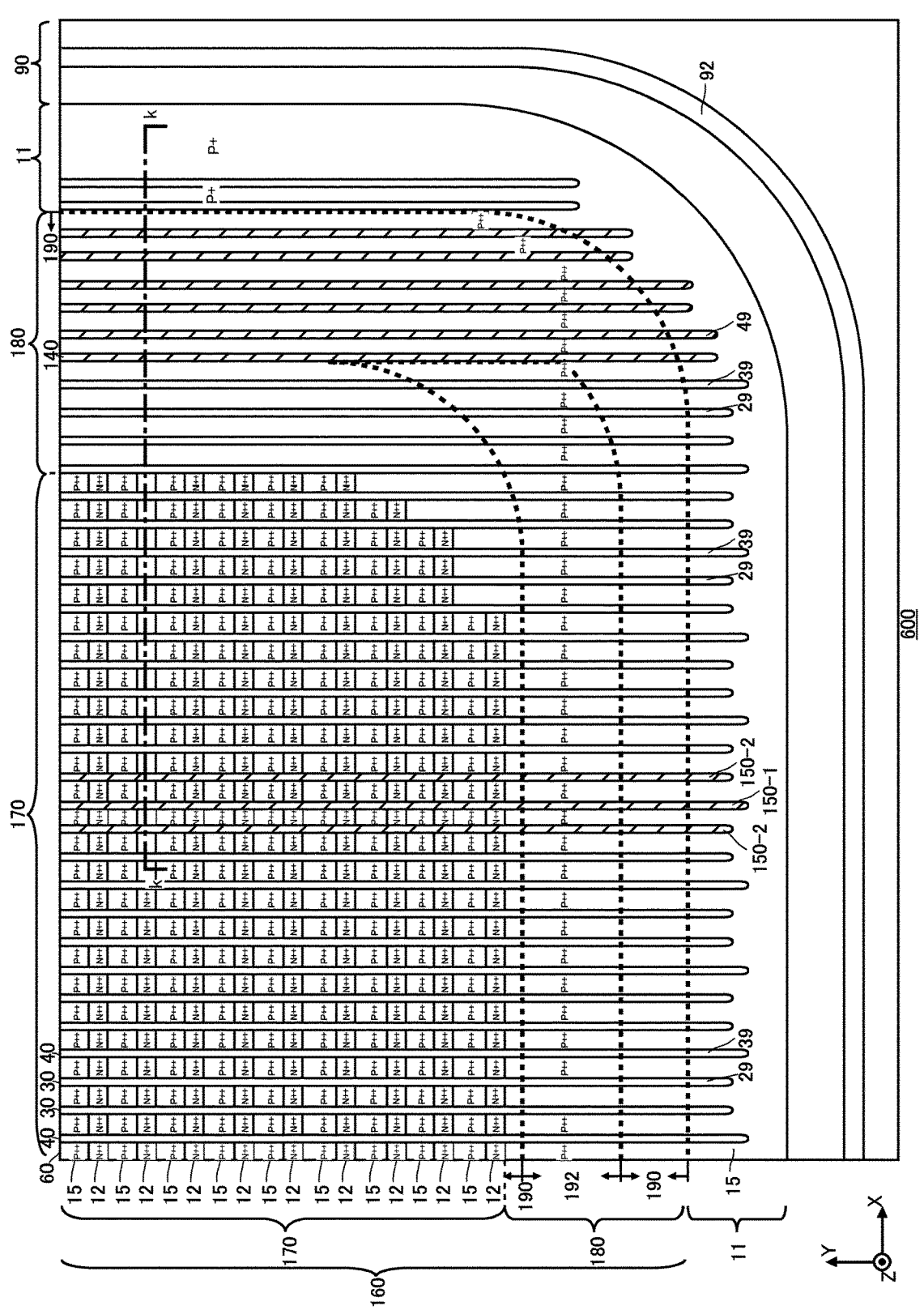
FIG. 18 is a top view showing an example of a semiconductor device 600 according to another embodiment.

FIG. 18 is a top view showing an example of a semiconductor device 600 according to another embodiment. The semiconductor device 600 of FIG. 18 is different from the semiconductor device 500 of FIG. 17 in that an active side deepening trench portion 150 is provided. Other configurations of the semiconductor device 600 of FIG. 18 may be the same as those of the semiconductor device 500 of FIG. 17.

In the present example, the active side deepening trench portion 150 is a deepening trench portion that is at least partially provided in the center portion 170. The active side deepening trench portion 150 may be provided in the circumferential well region 11. The active side deepening trench portion 150 may be provided in the circumferential portion 180. In FIG. 18, the active side deepening trench portion 150 is shown similarly to the circumferential side deepening trench portion 140 with hatching.

The active side deepening trench portion 150 has a trench portion, a dielectric film, and a conductive portion provided on the upper surface 21 of the semiconductor substrate 10. The active side deepening trench portion 150 may function as a dummy trench portion. The conductive portion of the active side deepening trench portion 150 may be connected to the emitter electrode 52. In FIG. 18, the active side deepening trench portion 150 that functions as a dummy trench portion is the active side deepening trench portion 150-2. The active side deepening trench portion 150 may function as a gate trench portion. The conductive portion of the active side deepening trench portion 150 may be connected to the gate runner 130. In FIG. 18, the active side deepening trench portion 150 that functions as a gate trench portion is the active side deepening trench portion 150-1. The active side deepening trench portion 150-1 may extend longer than the active side deepening trench portion 150-2 in the extending direction of the trench portions.

Figure 19:
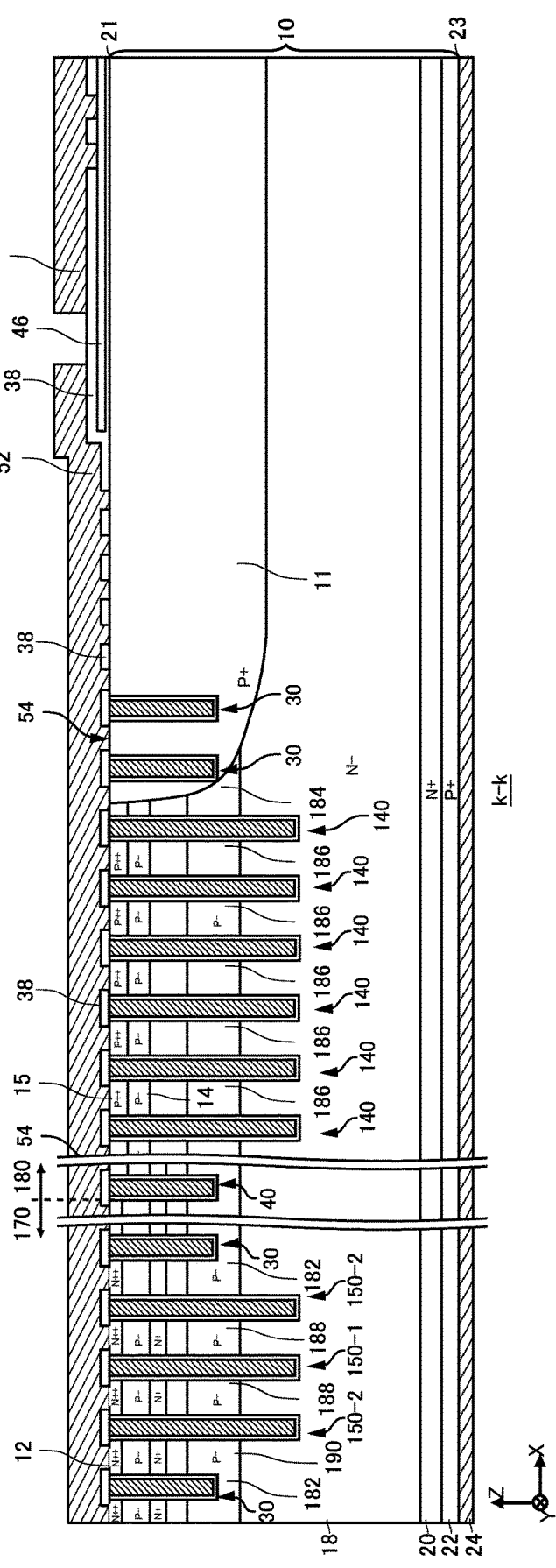
FIG. 19 is a drawing showing an example of a cross section k-k in FIG. 18.

FIG. 19 is a drawing showing an example of a cross section k-k in FIG. 18. The cross section k-k is an X-Z plane that passes through the emitter region 12 of the center portion 170. Note that the dimensions in FIG. 19 do not necessarily match the dimensions in FIG. 18. In the cross section, the semiconductor device 600 of the present example has the semiconductor substrate 10, the interlayer dielectric film 38, the emitter electrode 52, the collector electrode 24, and the gate runner 130. In FIG. 19, illustration of part of the semiconductor device 600 is omitted. Description of common reference numerals with FIG. 14 in FIG. 19 is omitted.

The active side deepening trench portion 150 is formed deeper than the bottom region 190. In FIG. 19, the active side deepening trench portion 150 is formed deeper than the active side bottom region 182. The active side deepening trench portion 150 may be formed deeper than the gate trench portion 40. The active side deepening trench portion 150 may be formed deeper than the dummy trench portion 30. The active side deepening trench portion 150 may be formed deeper than the circumferential well region 11. The active side deepening trench portion 150 may be formed at the same depth as the circumferential side deepening trench portion 140.

In the present example, since the active side deepening trench portion 150 is formed deeper than the bottom region 190, the bottom region 190 can be divided. In FIG. 19, the bottom region 190 provided between the respective active side deepening trench portions 150 in the array direction of the trench portions is an active side intermediate bottom region 188. By providing the active side deepening trench portion 150 in the center portion 170, the active side intermediate bottom region 188 can be provided in the center portion 170. Therefore, a pass through region of electrons can be provided. Accordingly, characteristics of the semiconductor device 600 can be improved.

Figure 20:
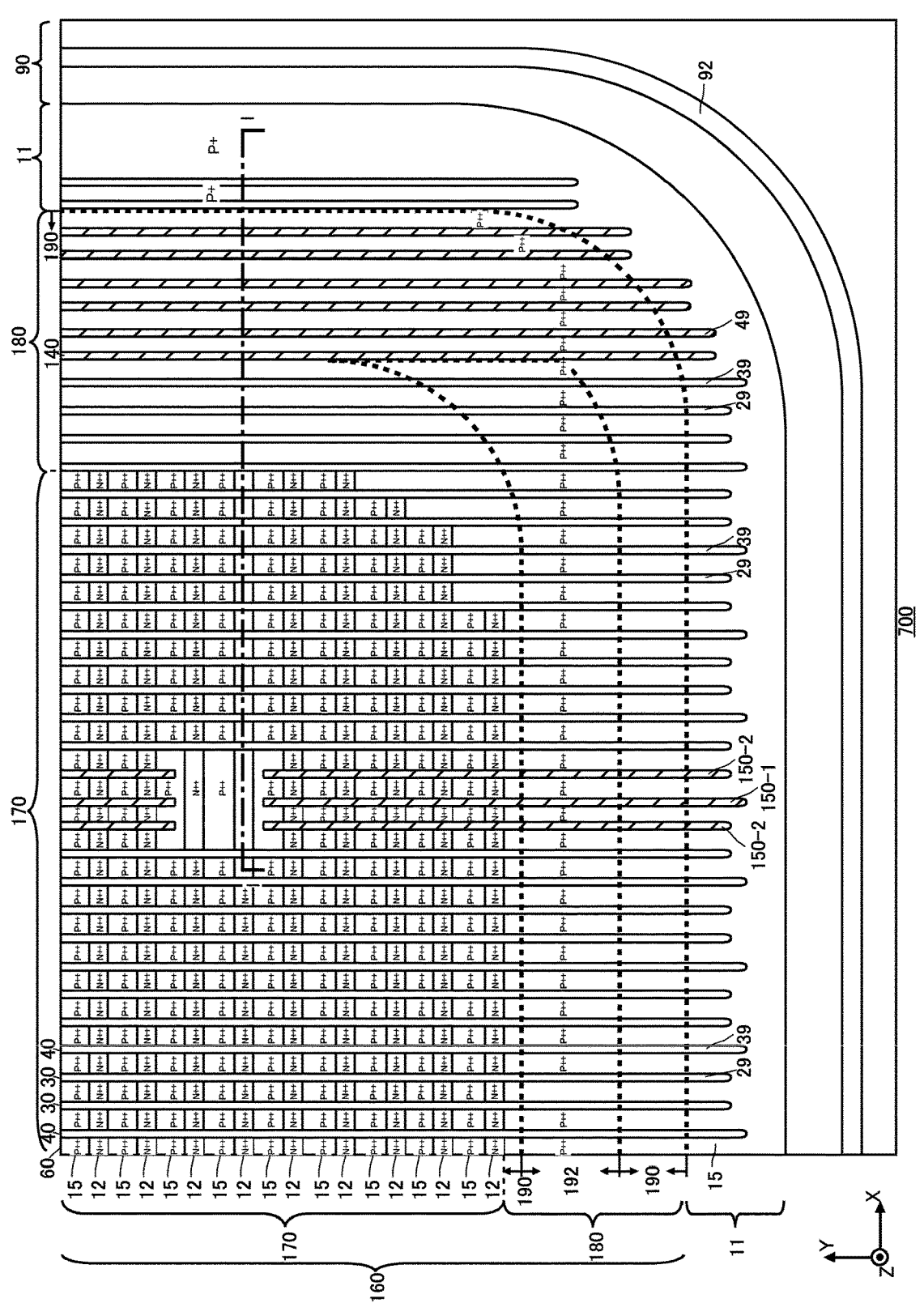
FIG. 20 is a top view showing an example of a semiconductor device 700 according to another embodiment.

FIG. 20 is a top view showing an example of a semiconductor device 700 according to another embodiment. The semiconductor device 700 of FIG. 20 is different from the semiconductor device 600 of FIG. 18 in that the active side deepening trench portion 150 is discretely provided. Other configurations of the semiconductor device 700 of FIG. 20 may be the same as the semiconductor device 600 of FIG. 18.

In the present example, the active side deepening trench portion 150 is provided discretely in the center portion 170. That is, a part of the active side deepening trench portion 150 may not be provided in the extending direction. By providing the active side deepening trench portion 150 discretely, the active side bottom region 182 and the active side intermediate bottom region 188 can be provided finely. Note that in a region in which the active side deepening trench portion 150 is not provided, a trench portion of the same depth as the gate trench portion 40 or the dummy trench portion 30 may be provided.

Figure 21:
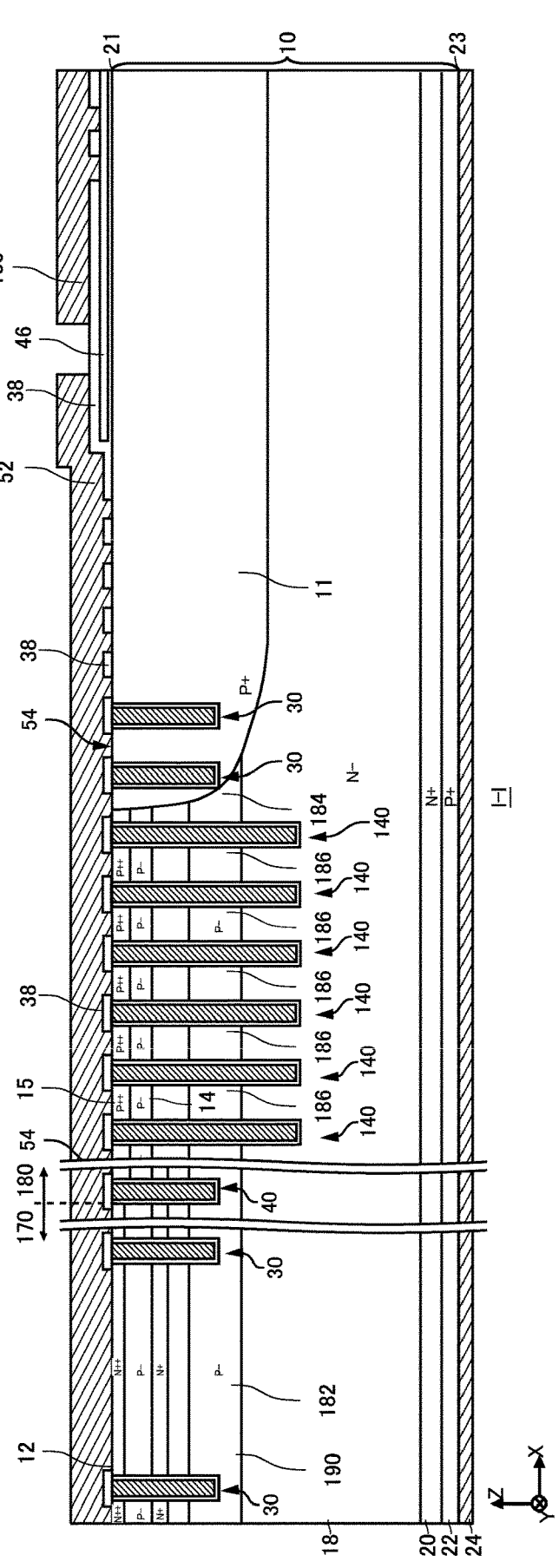
FIG. 21 is a drawing showing an example of a cross section l-l in FIG. 20.

FIG. 21 is a drawing showing an example of a cross section l-l in FIG. 20. The cross section l-l is an X-Z plane that passes through the emitter region 12 of the center portion 170. The cross section l-l is an X-Z plane that does not pass through the active side deepening trench portion 150. Note that the dimensions in FIG. 21 do not necessarily match the dimensions in FIG. 20. In the cross section, the semiconductor device 700 of the present example has the semiconductor substrate 10, the interlayer dielectric film 38, the emitter electrode 52, the collector electrode 24, and the gate runner 130. In FIG. 21, illustration of part of the semiconductor device 700 is omitted.

In the cross section 1-1, the active side deepening trench portion 150 is not provided. Accordingly, in the cross section, the center portion 170 is provided with the active side bottom region 182. In the cross section, the center portion 170 is not provided with the active side intermediate bottom region 188.

Figure 22:
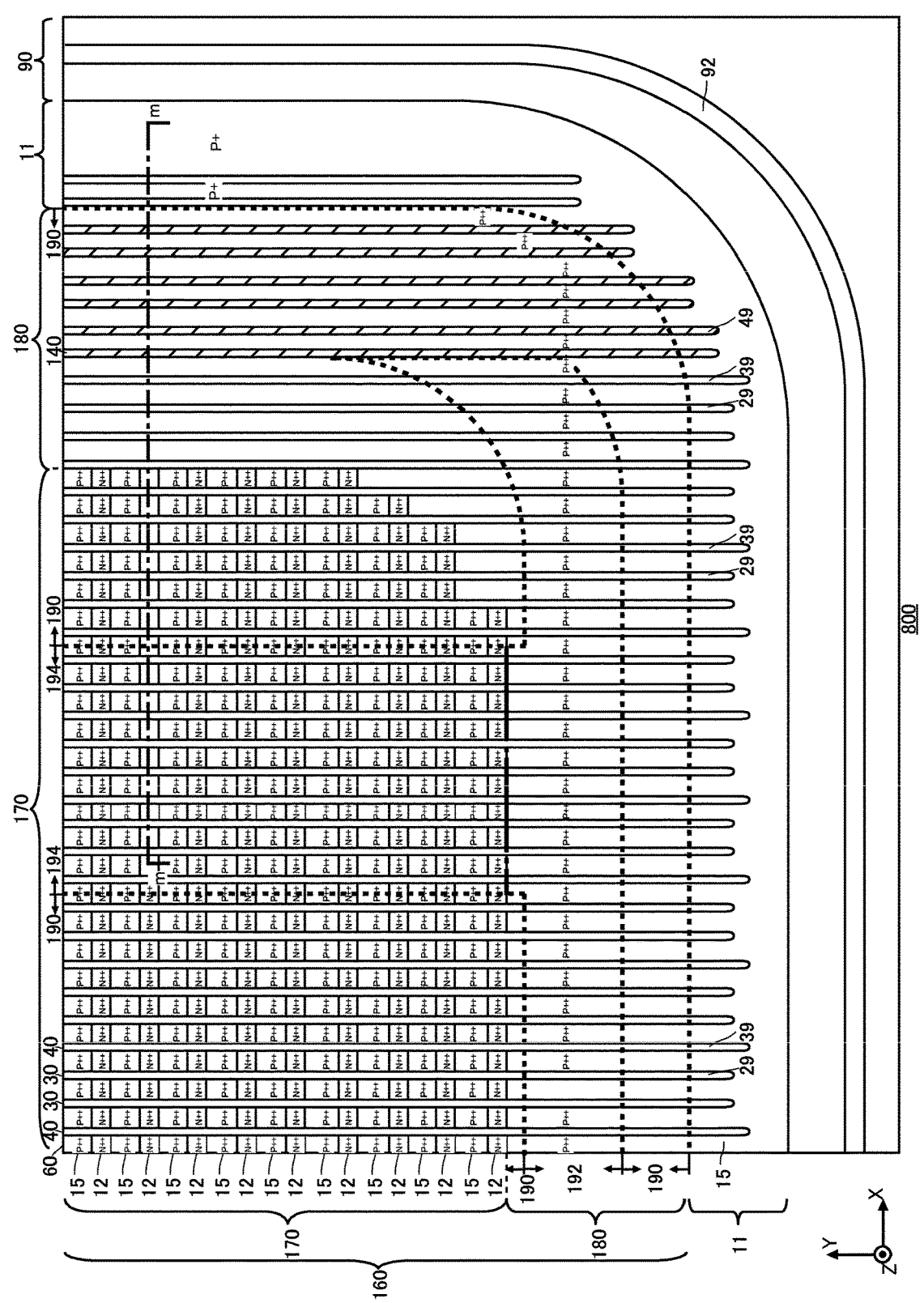
FIG. 22 is a top view showing an example of a semiconductor device 800 according to another embodiment.

FIG. 22 is a top view showing an example of a semiconductor device 800 according to another embodiment. The semiconductor device 800 of FIG. 22 is different from the semiconductor device 500 of FIG. 17 in that an active side bottomless region 194 is provided in the center portion 170. Other configurations of the semiconductor device 800 of FIG. 22 may be the same as those of the semiconductor device 500 of FIG. 17.

The active side bottomless region 194 is the bottomless region 192 provided in the center portion 170. In FIG. 22, a boundary between the active side bottomless region 194 and the bottomless region 192 other than the active side bottomless region 194 is shown by a dashed line. The active side bottomless region 194 may be sandwiched by the active side bottom region 182 in a top view. The active side bottomless region 194 may be surrounded by the active side bottom region 182 in a top view. The active side bottomless region 194 may be connected to the bottomless region 192 other than the active side bottomless region 194.

Figure 23:
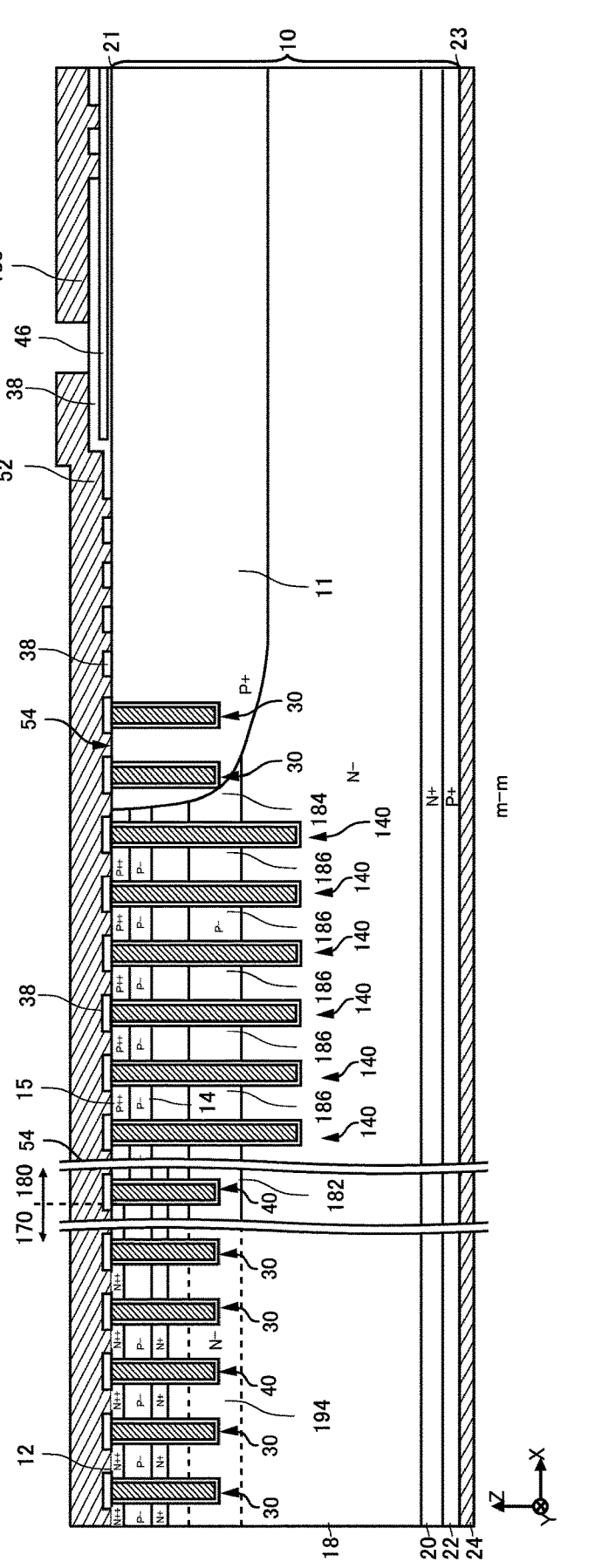
FIG. 23 is a drawing showing an example of a cross section m-m in FIG. 22.

FIG. 23 is a drawing showing an example of a cross section m-m in FIG. 22. The cross section m-m is an X-Z plane that passes through the emitter region 12 of the center portion 170. The cross section m-m is an X-Z plane that passes through the active side bottomless region 194. Note that the dimensions in FIG. 23 do not necessarily match the dimensions in FIG. 22. In the cross section, the semiconductor device 800 of the present example has the semiconductor substrate 10, the interlayer dielectric film 38, the emitter electrode 52, the collector electrode 24, and the gate runner 130. In FIG. 23, illustration of a part of the semiconductor device 800 is omitted.

The active side bottomless region 194 is provided at the same depth as the active side bottom region 182 in the depth direction of the semiconductor substrate 10. By providing the active side bottomless region 194 in the center portion 170, the disposition of the active side bottom region 182 can be changed without providing the active side deepening trench portion in the center portion 170. The active side bottomless region 194 is provided with a first conductivity type drift region 18.

Figure 24:
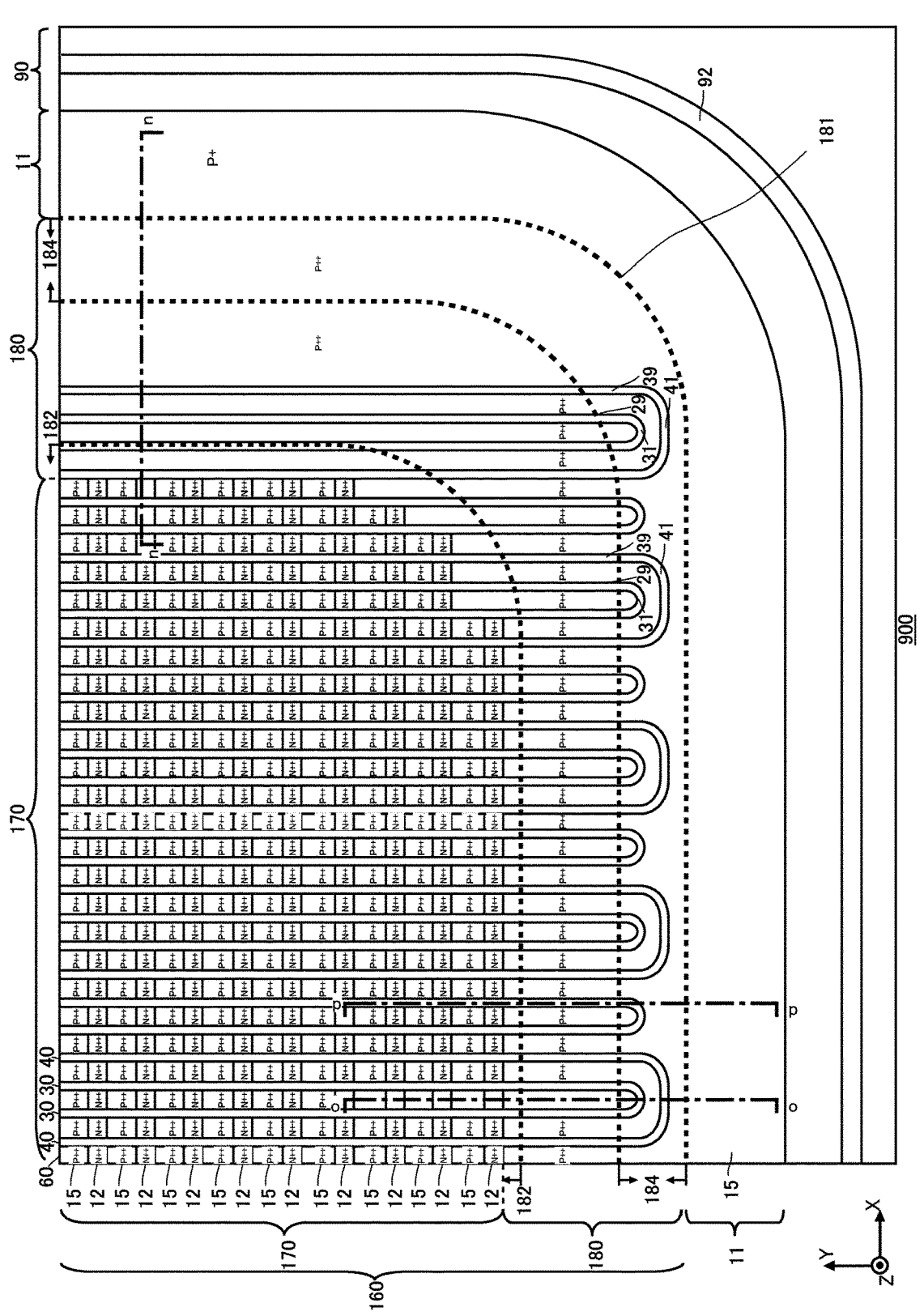
FIG. 24 is a top view showing an example of a semiconductor device 900 according to another embodiment.

FIG. 24 is a top view showing an example of a semiconductor device 900 according to another embodiment. The semiconductor device 900 of FIG. 24 is different from the semiconductor device 100 of FIG. 2 in the disposition of the trench portion. Other configurations of the semiconductor device 900 of FIG. 24 may be the same as those of the semiconductor device 100 of FIG. 2.

In the present example, the trench portion is not provided nearby a corner portion 181 of the circumferential portion 180. The corner portion 181 is a corner that connects the ends of the circumferential portion 180. In FIG. 24, the corner portion 181 and the trench portion do not overlap in the extending direction.

In the present example, the edge portion 41 of the gate trench portion 40 is not provided in the circumferential well region 11. In FIG. 24, the edge portion 41 of the gate trench portion 40 is provided in the circumferential portion 180. In the present example, the edge portion 31 of the dummy trench portion 30 is not provided in the circumferential well region 11. In FIG. 24, the edge portion 31 of the dummy trench portion 30 is provided in the circumferential portion 180.

Figure 25:
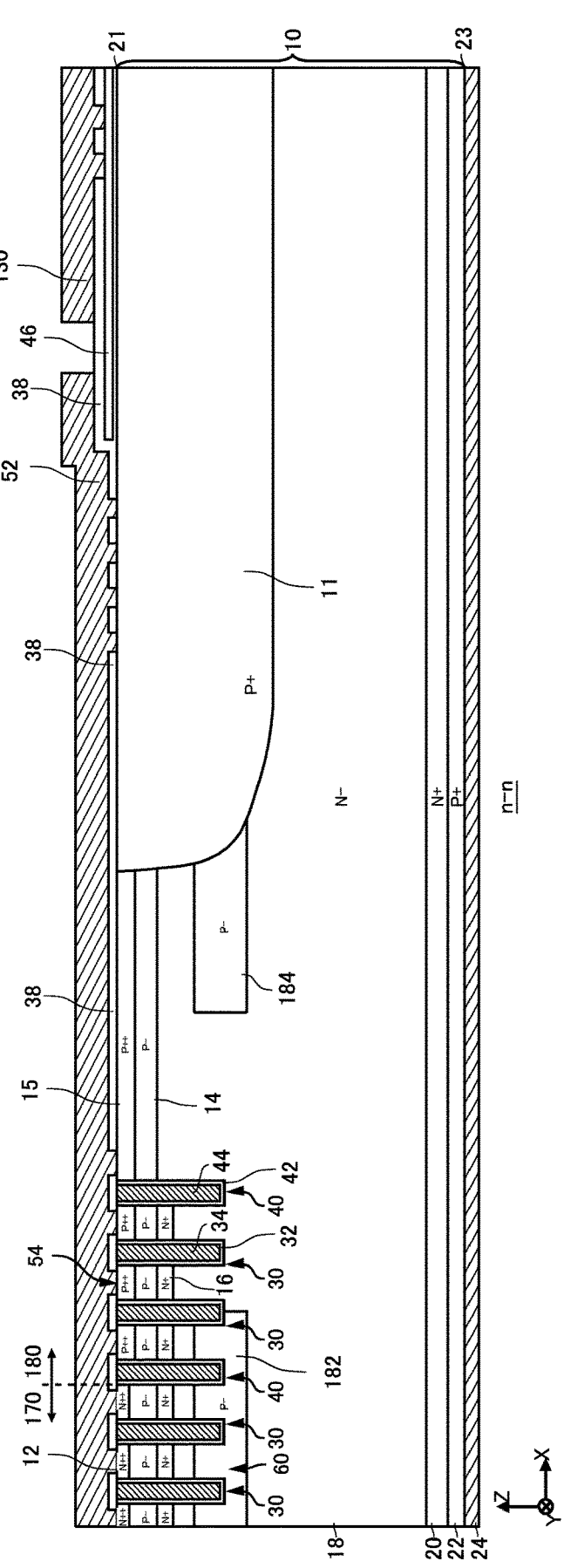
FIG. 25 is a drawing showing an example of a cross section n-n in FIG. 24.

FIG. 25 is a drawing showing an example of a cross section n-n in FIG. 24. The cross section n-n is an X-Z plane that passes through the emitter region 12 of the center portion 170. Note that the dimensions in FIG. 25 do not necessarily match the dimensions in FIG. 24. In the cross section, the semiconductor device 900 of the present example has the semiconductor substrate 10, the interlayer dielectric film 38, the emitter electrode 52, the collector electrode 24, and the gate runner 130. In the cross section, the circumferential side bottom region 184 is not provided with the trench portion. Even such a configuration allows to eliminate unbalanced breakdown voltage.

Figure 26:
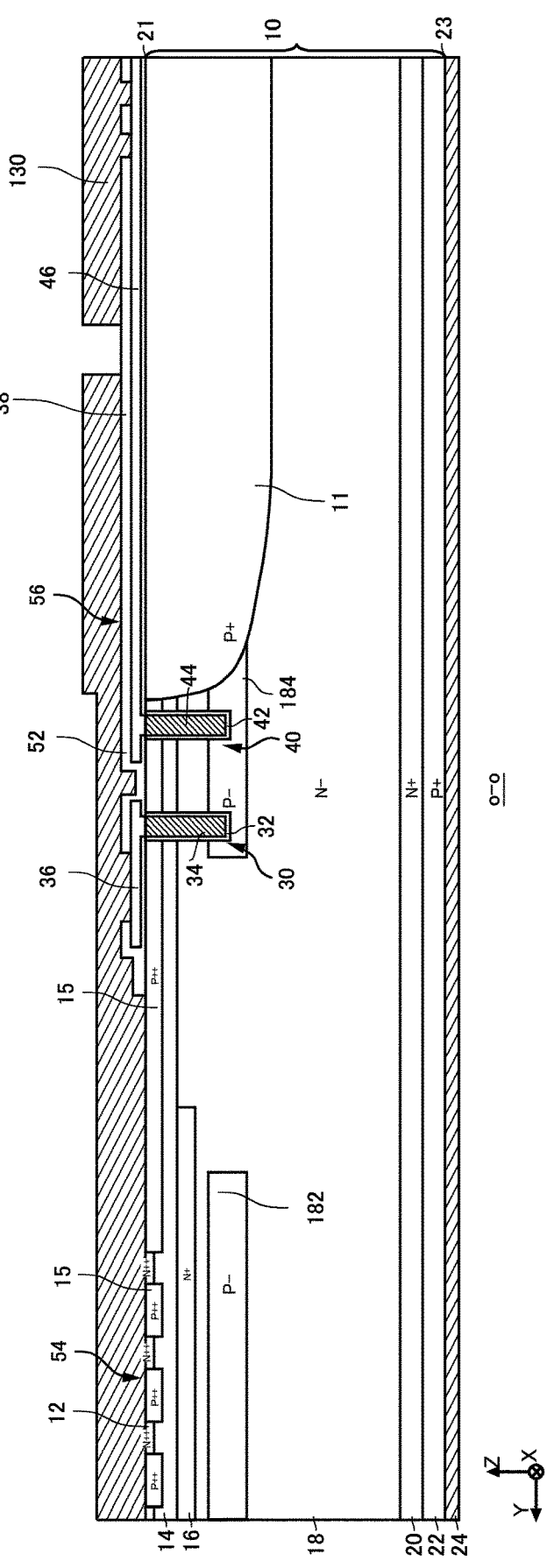
FIG. 26 is a drawing showing an example of a cross section o-o in FIG. 24.

FIG. 26 is a drawing showing an example of a cross section o-o in FIG. 24. The cross section o-o is a Y-Z plane that passes through the edge portion 41 of the gate trench portion 40 and the edge portion 31 of the dummy trench portion 30. Note that the dimensions in FIG. 26 do not necessarily match the dimensions in FIG. 24. In the cross section, the semiconductor device 900 of the present example has the semiconductor substrate 10, the interlayer dielectric film 38, the emitter electrode 52, the collector electrode 24, and the gate runner 130. In the cross section, the circumferential side bottom region 184 is provided with the gate trench portion 40 and the dummy trench portion 30.

Figure 27:
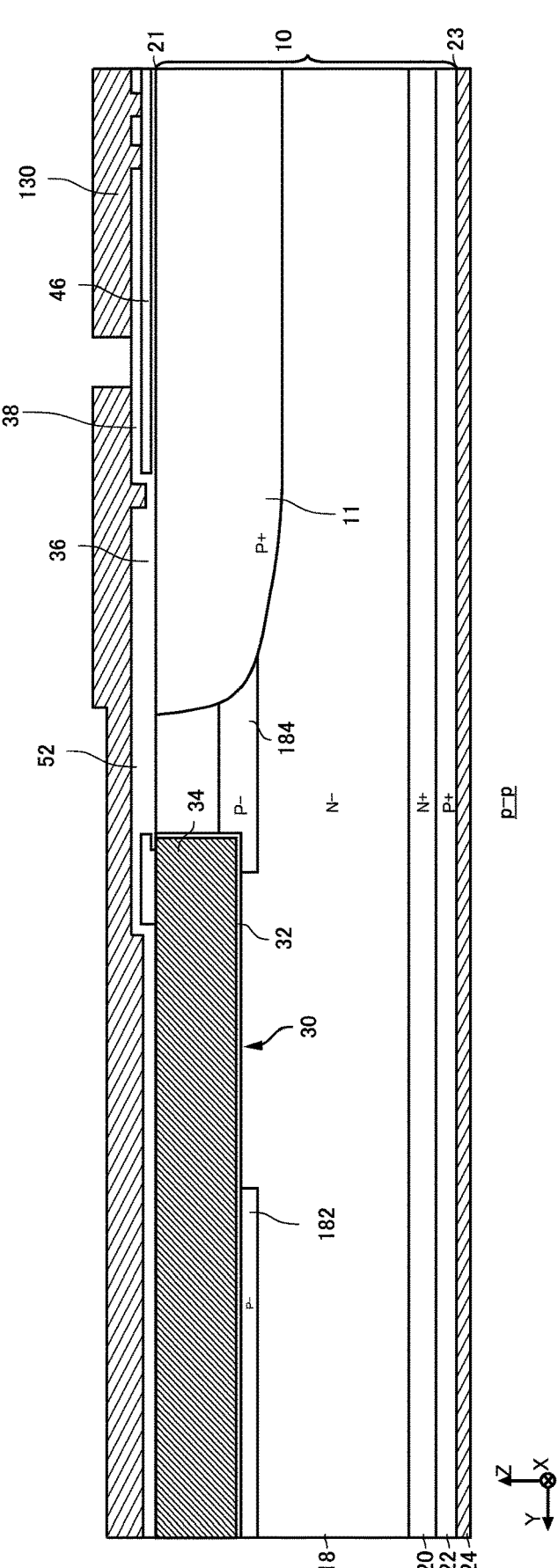
FIG. 27 is a drawing showing an example of a cross section p-p in FIG. 24.

FIG. 27 is a drawing showing an example of a cross section p-p in FIG. 24. The cross section p-p is a Y-Z plane that passes through the linear portion 29 of the dummy trench portion 30. Note that the dimensions in FIG. 27 do not necessarily match the dimensions in FIG. 24. In the cross section, the semiconductor device 900 of the present example has the semiconductor substrate 10, the interlayer dielectric film 38, the emitter electrode 52, the collector electrode 24, and the gate runner 130. In the cross section, the circumferential side bottom region 184 is provided with the dummy trench portion 30. The dummy trench portion 30 and the circumferential well region 11 are provided apart from each other.

Figure 28:
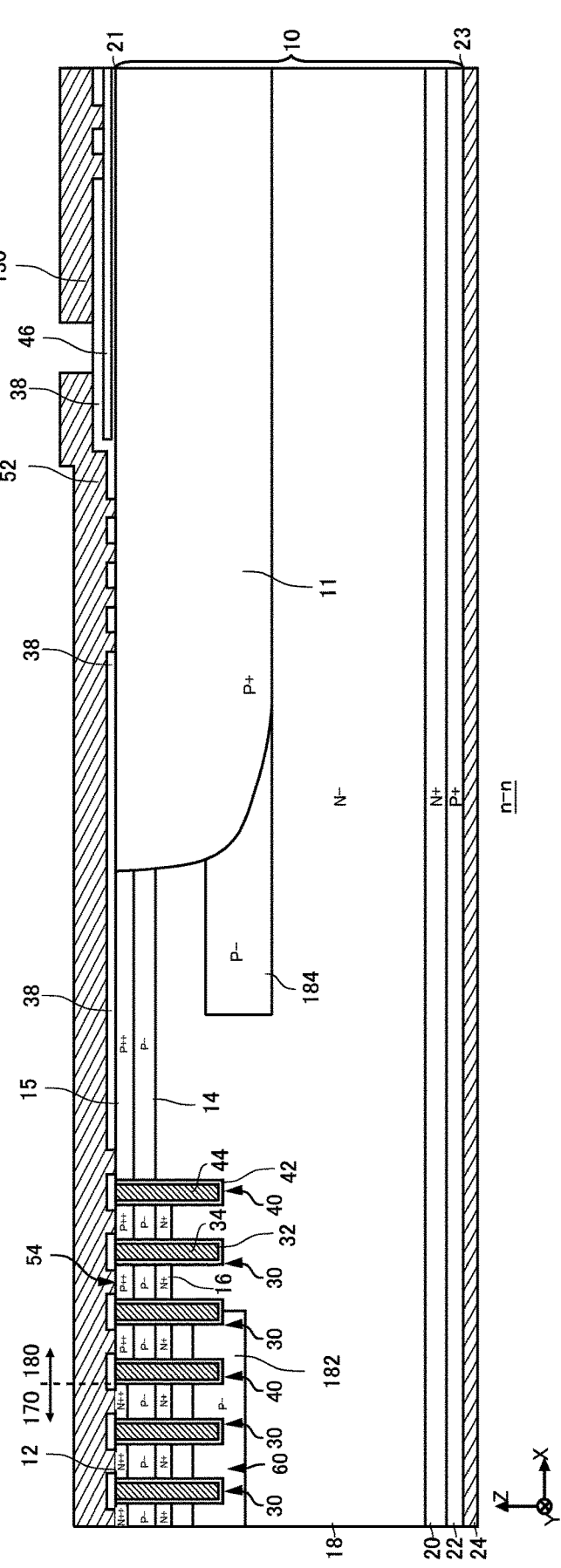
FIG. 28 is a drawing showing another example of the cross section n-n in FIG. 24.

FIG. 28 is a drawing showing another example of the cross section n-n in FIG. 24. FIG. 28 is different from FIG. 25 in that the circumferential side bottom region 184 is provided wider than the active side bottom region 182 in the depth direction of the semiconductor substrate 10. Other configurations of FIG. 28 may be the same as those of FIG. 25. In the present example, the circumferential side bottom region 184 is provided wider on the lower surface 23 side compared to the active side bottom region 182 and has approximately the same depth as the circumferential well region 11. By providing the circumferential side bottom region 184 to be wider than the active side bottom region 182, the electric field distribution can be adjusted. The active side bottom region 182 may be provided wider than the circumferential side bottom region 184.

While the present invention has been described above by using the embodiments, the technical scope of the present invention is not limited to the scope according to the above described embodiments. It is apparent to persons skilled in the art that various changes or improvements can be added to the above described embodiments. It is also apparent from the description of the scope of the claims that the embodiments added with such changes or improvements can fall within the technical scope of the present invention.

Note that the operations, procedures, steps, and stages of each process performed by a device, system, program, and method shown in the scope of the claims, specification, or drawings can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES 10 semiconductor substrate, 11 circumferential well region, 12 emitter region, 14 base region, 15 contact region, 16 accumulation region, 18 drift region, 20 buffer region, 21 upper surface, 22 collector region, 23 lower surface, 24 collector electrode, 29 linear portion, 30 dummy trench portion, 31 edge portion, 32 dummy dielectric film, 34 dummy conductive portion, 36 dummy polysilicon, 38 interlayer dielectric film, 39 linear portion 40 gate trench portion, 41 edge portion, 42 gate dielectric film, 44 gate conductive portion, 46 gate polysilicon, 49 linear portion, 51 edge portion, 52 emitter electrode, 54 contact hole, 56 contact hole, 60 mesa portion, 70 transistor portion, 90 edge termination structure portion, 92 guard ring, 100 semiconductor device, 130 gate runner, 140 circumferential side deepening trench portion, 150 active side deepening trench portion, 160 active portion, 162 end side, 164 gate pad, 170 center portion, 180 circumferential portion, 181 corner portion, 182 active side bottom region, 184 circumferential side bottom region, 186 circumferential side intermediate bottom region, 188 active side intermediate bottom region, 190 bottom region, 192 bottomless region, 194 active side bottomless region, 200 semiconductor device, 300 semiconductor device, 400 semiconductor device, 500 semiconductor device, 600 semiconductor device, 700 semiconductor device, 800 semiconductor device, 900 semiconductor device.

What is claimed is:

1. A semiconductor device comprising a semiconductor substrate, the semiconductor substrate comprising:

an active portion;

a circumferential well region of a second conductivity type surrounding the active portion in a top view; and a trench portion provided in the active portion on an upper surface of the semiconductor substrate, wherein the trench portion comprises a plurality of linear trench portions extending in parallel in an extending direction, wherein the plurality of linear trench portions are provided in a striped pattern in a top view, wherein each of the plurality of linear trench portions is spaced apart from its nearest neighboring one of the plurality of linear trench portions in an array direction, wherein each of the plurality of linear trench portions has a bottom, and wherein the active portion includes:

a center portion including an emitter region of a first conductivity type; and a circumferential portion surrounding the center portion, wherein the center portion includes an active side bottom region of the second conductivity type provided across and extending between the bottoms of at least two of the plurality of linear trench portions, the circumferential portion includes a circumferential side bottom region of the second conductivity type that is electrically connected to the circumferential well region, faces the active side bottom region, has an upper surface, extends from the circumferential well region toward the active side bottom region, and is provided at the bottom of one or more of the plurality of linear trench portions, the active side bottom region and the circumferential side bottom region are provided apart from each other in at least one of the array direction and the extending direction, and an upper surface of the circumferential side bottom region is provided closer to a lower surface of the semiconductor substrate than the upper surface of the semiconductor substrate in a depth direction of the semiconductor substrate.

2. The semiconductor device according to claim 1, wherein the active side bottom region is also provided in the circumferential portion.

3. The semiconductor device according to claim 1, wherein the active side bottom region is electrically floating.

4. The semiconductor device according to claim 1, wherein there is a boundary between the active portion and the well region, in a cross section in the extending direction through a portion of the semiconductor device where the boundary between the active portion and the well region is perpendicular to the extending direction, the active side bottom region and the circumferential side bottom region are provided apart from each other in the extending direction.

5. The semiconductor device according to claim 1, wherein in a cross section in the array direction through a portion of the semiconductor device where the well region, the plurality of linear trench portions, and the circumferential portion extend in parallel in the extending direction, the active side bottom region and the circumferential side bottom region are provided apart from each other in the array direction, the circumferential side bottom region terminates at the bottom of one of the plurality of the linear trench portions in a direction toward the active side bottom region in the array direction.

6. The semiconductor device according to claim 5, wherein in the cross section, the active side bottom region terminates at the bottom of another one of the plurality of linear trench portions.

7. The semiconductor device according to claim 1, wherein impurity concentrations of the active side bottom region and the circumferential side bottom region are the same.

8. The semiconductor device according to claim 1, wherein an impurity concentration of the circumferential side bottom region is larger than an impurity concentration of the active side bottom region.

9. The semiconductor device according to claim 1, wherein an impurity concentration of the circumferential well region is larger than the impurity concentration of the circumferential side bottom region.

10. The semiconductor device according to claim 1, wherein the active side bottom region and the circumferential side bottom region are provided at a same depth in a depth direction of the semiconductor substrate.

11. The semiconductor device according to claim 1, wherein the circumferential side bottom region is provided wider than the active side bottom region in a depth direction of the semiconductor substrate.

12. The semiconductor device according to claim 1, wherein a distance in the array direction of the plurality of linear trench portions of the active side bottom region and the circumferential side bottom region is a pitch width of the striped pattern of the plurality of linear trench portions or more and twenty times or less of the pitch width of the striped pattern of the plurality of linear trench portions.

13. The semiconductor device according to claim 12, wherein the distance in the array direction of the active side bottom region and the circumferential side bottom region is 2 μm or more and 40 μm or less.

14. The semiconductor device according to claim 1, wherein the plurality of linear trench portions comprises:

a plurality of linear gate trench portions; and a plurality of linear dummy trench portions, wherein at least one of the plurality of linear gate trench portion is provided between the active side bottom region and the circumferential side bottom region in a depth direction of the semiconductor substrate.

15. The semiconductor device according to claim 1, wherein the circumferential side bottom region is provided in a range that is five times or less a pitch width of the stripe pattern of the plurality of linear trench portions from the circumferential well region in the array direction of the plurality of linear trench portions.

16. The semiconductor device according to claim 15, wherein a distance in the array direction of the active side bottom region and the circumferential side bottom region is larger than a width in which the circumferential side bottom region is provided.

17. The semiconductor device according to claim 1, further comprising:

a drift region of the first conductivity type; and a buffer region of the first conductivity type provided between the drift region and a lower surface of the semiconductor substrate, wherein the trench portion comprises at least one circumferential side deepening trench portion that is provided between the active side bottom region and the circumferential side bottom region in the array direction of the trench portion in the circumferential portion, and is formed deeper than the active side bottom region and the circumferential side bottom region, but does not reach the buffer region.

18. The semiconductor device according to claim 17, wherein the trench portion comprises an active side deepening trench portion that is at least partially provided in the center portion, and is formed deeper than the active side bottom region.

19. The semiconductor device according to claim 17, wherein the center portion comprises an active side bottomless region of the first conductivity type that is sandwiched by the active side bottom region in a top view, and is provided at a same depth as the active side bottom region in a depth direction of the semiconductor substrate.

20. The semiconductor device according to claim 1, further comprising:

an edge termination structure portion surrounding the active portion in a top view, wherein the edge termination structure portion comprises a region of the second conductivity type.

21. The semiconductor device according to claim 17, wherein the at least one circumferential side deepening trench portion comprises a trench, a dielectric film, and a conductive portion, and the at least one circumferential side deepening trench portion has an inner wall, the dielectric film is formed on the inner wall of the at least one circumferential side deepening trench portion, the conductive portion is provided farther inward than the dielectric film inside the at least one circumferential side deepening trench portion such that the dielectric film insulates the conductive portion from the semiconductor substrate.

22. The semiconductor device according to claim 21, further comprising:

a gate pad; and a gate runner, wherein the conductive portion of the at least one circumferential side deepening trench portion is electrically connected to the gate pad via the gate runner.

23. The semiconductor device according to claim 1, wherein, in a cross section in the array direction through a portion of the semiconductor device where the well region, the plurality of linear trench portions, and the circumferential portion extend in parallel in the extending direction, the circumferential side bottom region has a terminal end, and one of the plurality of linear trench portions, which includes a trench, a dielectric film, and a conductive portion, is in contact with the terminal end of the circumferential side bottom region.

24. The semiconductor device according to claim 23, wherein the conductive portion of the one of the plurality of linear trench portions in contact with the terminal end of the circumferential side bottom region is electrically connected to a gate pad via a gate runner, and the one of the plurality of linear trench portions in contact with the terminal end of the circumferential side bottom region has an inner wall, the dielectric film is formed on the inner wall of the one of the plurality of linear trench portions in contact with the terminal end of the circumferential side bottom region, the conductive portion is provided farther inward than the dielectric film inside the one of the plurality of linear trench portions in contact with the terminal end of the circumferential side bottom region such that the dielectric film insulates the conductive portion from the semiconductor substrate.

* * * * *